(12) United States Patent
Okada et al.

(10) Patent No.: US 8,597,989 B2
(45) Date of Patent: *Dec. 3, 2013

(54) MANUFACTURING METHOD OF SEMICONDUCTOR DEVICE

(71) Applicant: Renesas Electronics Corporation, Kawasaki (JP)

(72) Inventors: Makio Okada, Kanagawa (JP); Hidetoshi Kuraya, Kanagawa (JP); Toshio Tanabe, Kanagawa (JP); Yoshinori Fujisaki, Kumamoto (JP); Kotaro Arita, Kumamoto (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/726,326

(22) Filed: Dec. 24, 2012

(65) Prior Publication Data

US 2013/0109138 A1    May 2, 2013

Related U.S. Application Data

(63) Continuation of application No. 13/348,722, filed on Jan. 12, 2012, now Pat. No. 8,349,661.

(30) Foreign Application Priority Data

Jan. 12, 2011   (JP) .................................. 2011-003560

(51) Int. Cl.
*H01L 21/44*    (2006.01)

(52) U.S. Cl.
USPC ............................ 438/127; 438/124; 438/126

(58) Field of Classification Search
USPC ........................................ 438/112, 121–127
See application file for complete search history.

(56) References Cited

U.S. PATENT DOCUMENTS

| | | | |
|---|---|---|---|
| 5,517,056 A | 5/1996 | Bigler et al. | |
| 5,763,942 A | 6/1998 | Suzuki | |
| 5,817,545 A | 10/1998 | Wang et al. | |
| 5,929,511 A | 7/1999 | Nakazawa et al. | |
| 6,048,656 A | 4/2000 | Akram et al. | |
| 7,928,542 B2 | 4/2011 | Lee | |
| 8,349,661 B2 * | 1/2013 | Okada et al. ................. | 438/127 |

FOREIGN PATENT DOCUMENTS

JP            10-270602 A    10/1998

* cited by examiner

*Primary Examiner* — Kevin M Picardat
(74) *Attorney, Agent, or Firm* — Miles & Stockbridge P.C.

(57) ABSTRACT

The yield of semiconductor devices is improved. In an upper die of a resin molding die including a pair of the upper die and a lower die, by lengthening the radius of the cross section of an inner peripheral surface of a second corner part facing an injection gate of a cavity more than that of the other corner part, a void contained in a resin in resin injection can be pushed out into an air vent without allowing the void to remain in the second corner part of the cavity. Consequently, the occurrence of the void in the cavity can be prevented and then the occurrence of the appearance defect of the semiconductor device can be prevented.

7 Claims, 24 Drawing Sheets

US 8,597,989 B2

MANUFACTURING METHOD OF SEMICONDUCTOR DEVICE

CROSS-REFERENCE TO RELATED APPLICATION

The disclosure of Japanese Patent Application No. 2011-3560 filed on Jan. 12, 2011 including the specification, drawings and abstract is incorporated herein by reference in its entirety.

BACKGROUND

The present invention relates to a technology of manufacturing semiconductor devices, and particularly, to a technology effective when applied to resin molding.

Patent Document 1 (Japanese Patent Laid-Open No. 1998-270602) discloses a structure in which electronic parts mounted on a circuit substrate are covered with a sealing layer including a thermoplastic resin, and a method for forming the sealing layer by the thermoplastic resin.

SUMMARY

Recently, semiconductor devices have attempted to thin a gold wire (electroconductive wire) for cost reduction. A molding (resin sealing) process in the assembling of resin-sealed semiconductor devices tends to cause wire displacement in the resin sealing, due to thinning of a gold wire.

To prevent the wire displacement, a high-fluidity molding resin having a low viscosity in a melted state is adopted as a molding resin (sealing resin) used for the resin sealing. A high-fluidity molding resin, which has a low viscosity (which is soft), easily form a large resin burr (resin blowout) in the air vent of a resin molding die. When a large resin burr is formed, the appearance of the semiconductor device may be defective. Alternatively, in mounting the semiconductor device on a mounting substrate, a large resin burr may fall on the substrate land (foot pattern) of the mounting substrate to cause defective conduction (mounting defect) between the semiconductor device and the mounting substrate.

To minimize the resin burr, the opening of the air vent is small.

The small opening of the air vent can prevent the resin burr and can hardly escapes the air.

As a result, a void tends to occur in a corner part near the air vent of the cavity. When the void remains in the die, a void is formed on the surface of a sealing body and then the appearance of the semiconductor device becomes defective. Consequently, the yield of the semiconductor device lowers.

Particularly, the remaining of the void tends to occur near the air vent which is farthest from the injection gate of the molding resin.

FIGS. 29 and 30 show the structure of a resin molding die in a comparative example for resin molding of a semiconductor device for which the present inventor compared. Furthermore, FIGS. 31 to 34 show the state of resin flow in a comparative example in resin sealing of the semiconductor device for which the present inventor compared.

As shown in FIGS. 29 and 30, the resin molding die has a pair of an upper die 30 and a lower die 31. The upper die 30 has a runner 37 to be a resin flow path, a cavity 33 adjacent to the runner 37 via an injection gate 32, and air vents 35 adjacent to the cavity 33. As shown in a partially enlarged cross-sectional view in FIG. 29, the opening of the air vent 35 has a height (H) of around 30 μm to prevent the resin burr as much as possible.

When the resin is sealed by using the resin molding die, as shown in FIGS. 31 and 32, a molding resin 34 is injected into the cavity 33 with an injection pressure of P via the injection gate 32, and proceeds involving a void 36 toward the air vent 35 which is farthest and opposite from the injection gate 32.

After that, as shown in FIGS. 33 and 34, most of voids 36 escape to the air vent 35 along a resin flow Q. When the opening of the air vent 35 is small (when the height of the air vent is around 30 μm), the voids 36 partially fails to escape and remain in the corner part 33a of the cavity 33 in FIG. 31.

As a result, a void is formed at a corner part of the sealing body of the semiconductor device after the resin sealing. This causes a defective appearance and lowers the yield of the semiconductor device.

The Patent Document 1 (Japanese Patent Laid-Open No. 1998-270602) fails to refer to a problem that avoid remains in a die. This patent document fails to disclose a size, such as a radius, of the cross section of the inner peripheral surface at the corner part of the cavity of the die. The document describes that all the corner parts of the cavity of the die are processed so that each of them has a curved surface. If the radius of the cross section of the curved surface of the corner part becomes longer, a surface for forming the air vent and then the opening of the air vent become small. The smaller the semiconductor device is, the more difficult providing the air vent is.

The present invention has been made in view of the above circumstances. One of the purposes is to provide a technology for preventing a void in a die and improving the yield of a semiconductor device.

Another purpose is to provide a technology for improving the quality of a semiconductor device.

The description of the present specification and the accompanying drawings will clarify the other purposes and the new feature of the present invention.

The following outlines a typical invention among the inventions disclosed in the present application.

The manufacturing method of a semiconductor device in accordance with a representative embodiment is that of a semiconductor device having a sealing body including an upper surface, and a first side surface on which an air vent resin is formed and which is adjacent to the upper surface, the method having the steps of: (a) preparing a resin molding die on which a cavity corresponding to a shape of the sealing body is formed for at least one of a pair of a first die and a second die, and which includes an injection gate and an air vent adjacent to the cavity, (b) arranging a plate-shaped member with a semiconductor chip mounted between the first die and the second one, and clamping both the dies with the semiconductor chip covered with the cavity, and (c) injecting a sealing resin from the injection gate into the cavity to form the sealing body over the plate-shaped member. The cavity of the resin molding die includes a corner part for forming an edge part of the sealing body including the first side surface corresponding to the air vent which is farthest from the injection gate, and the upper surface. A radius of the cross section of an inner peripheral surface of the corner part of the cavity is larger than that of the other corner part of the cavity forming the other edge part of the sealing body.

The manufacturing method of a semiconductor device according to another representative embodiment is that of a semiconductor device having a sealing body including an upper surface, a first side surface on which an air vent resin is formed and which is adjacent to the upper surface, and a second side surface which is adjacent to the upper surface and the first surface, the method having the steps of (a) preparing a resin molding die on which a cavity corresponding to a shape of the sealing body is formed for at least one of a pair of a first die and a second one, and which includes an injection gate and an air vent adjacent to the cavity, (b) arranging a plate-shaped member with a semiconductor chip mounted between the first die and the second die, and clamping both the dies with the semiconductor chip covered with the cavity, and (c) injecting a sealing resin from the injection gate into the cavity to form the sealing body over the plate-like member. The cavity of the resin molding die includes a first corner part for forming a first edge part of the sealing body including the first side surface corresponding to the air vent which is farthest from the injection gate, and the second side surface; and a second corner part for forming a second edge part of the sealing body including the first side surface and the upper surface. A radius of a cross section of an inner peripheral surface of the second corner part is larger than that of the first corner part.

The following explains briefly the effect acquired by the typical invention among the inventions disclosed in the present application.

The defective appearance of semiconductor devices can be prevented to improve the yield of semiconductor devices.

Further, the quality of semiconductor devices can be improved.

DETAILED DESCRIPTION

In embodiments below, except for cases particularly necessary, no explanation of the same or similar parts is repeated as a rule.

Furthermore, the following embodiments will be explained, divided into sections or embodiments, if necessary for convenience. Except for the case where it shows clearly in particular, they are not mutually unrelated and one has relationships such as a modification, details, and supplementary explanation of some or entire of another.

Moreover, in the following embodiments, in referring to the number of elements, (including the number, a numeric value, an amount, and a range), they should not be restricted to the specific number but may be greater or smaller than the specific number, except for the case where they are clearly specified in particular and where they are clearly restricted to a specific number theoretically.

In addition, in the following embodiments, an element (including an element step) is not necessarily indispensable, except for the case where it is clearly specified in particular and where it is considered to be clearly indispensable theoretically.

Furthermore, in the following embodiments, phrases "consisting of A," "constituted of A," "having A" and "including A" include other elements, except for the case where it is clearly specified in particular to be restricted to the element. Similarly, in the following embodiments, when shape and position relationship of an element are referred to, what resembles or is similar to the shape, etc. shall be included, except for the case where it is clearly specified in particular and where it is considered to be clearly not right theoretically. This statement also applies to the numeric value and range described above.

Embodiments of the present invention are explained in detail in accordance with the drawings. In all the drawings for explaining embodiments, the same symbol is attached to the members having the same function, and its repeated explanation is omitted.

(Embodiment 1)

Figure 1:
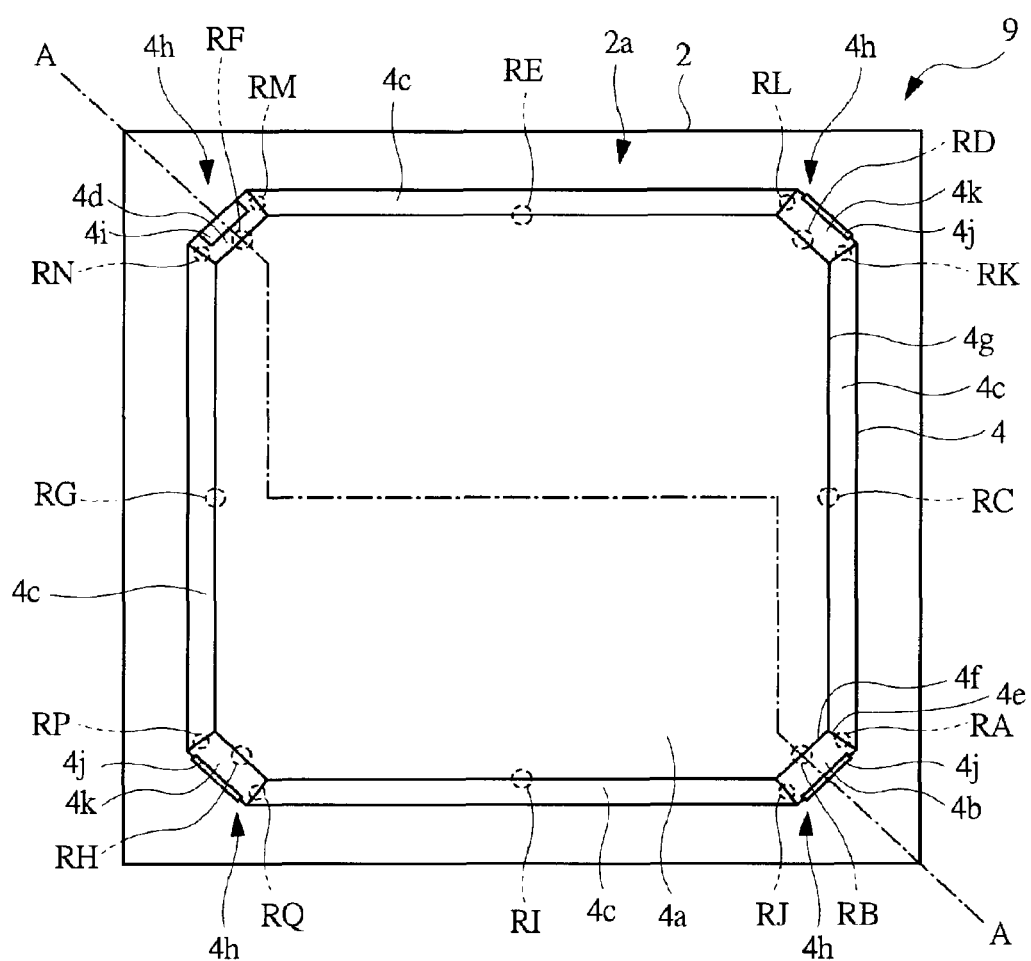
FIG. 1 is a plan view showing a structure of the semiconductor device in accordance with the embodiment 1 of the present invention.
Figure 2:
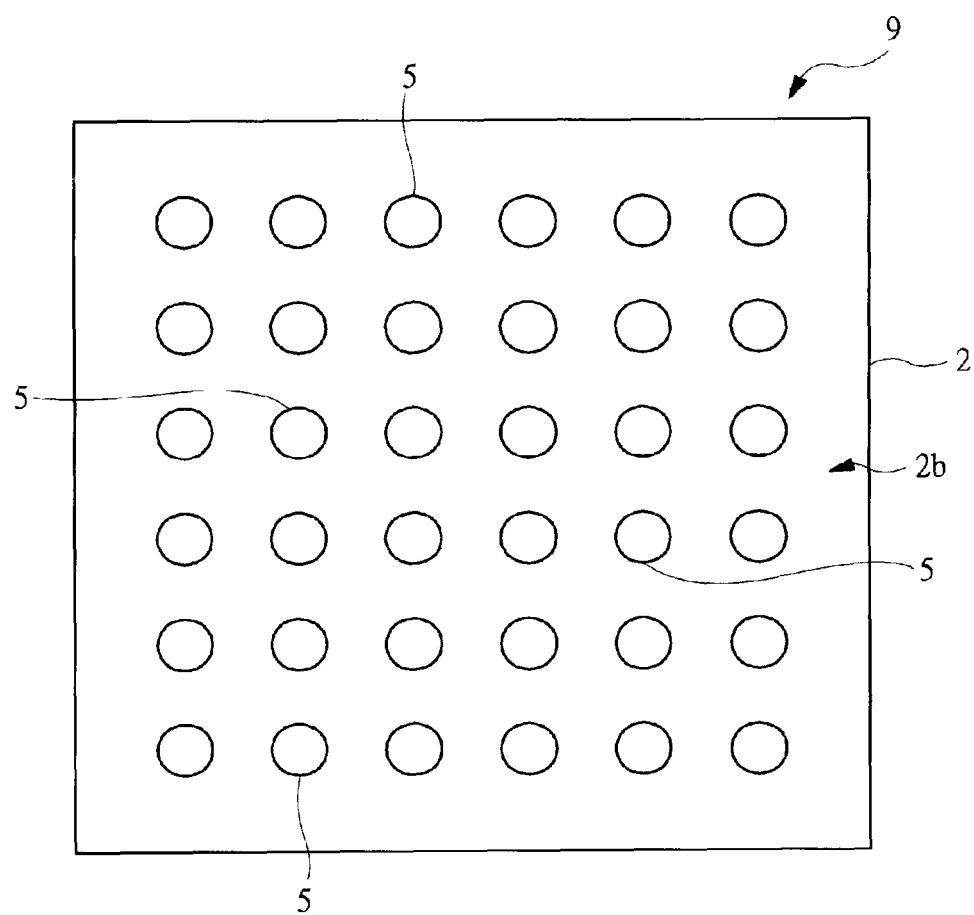
FIG. 2 is a back view showing a structure of the semiconductor device shown in FIG. 1.
Figure 3:
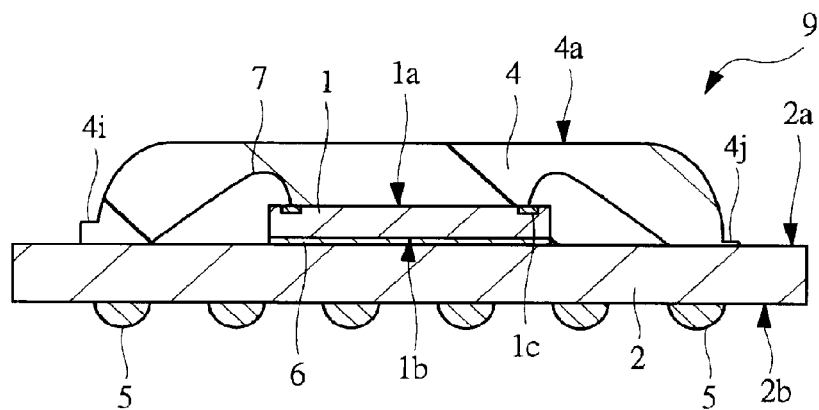
FIG. 3 is a cross-sectional view showing a structure cut along the A-A line in FIG. 1.
Figure 4:
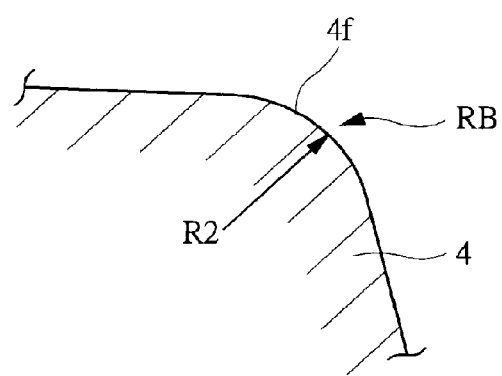
FIG. 4 is a partially enlarged cross-sectional view showing a structure of the RB part in FIG. 1.
Figure 5:
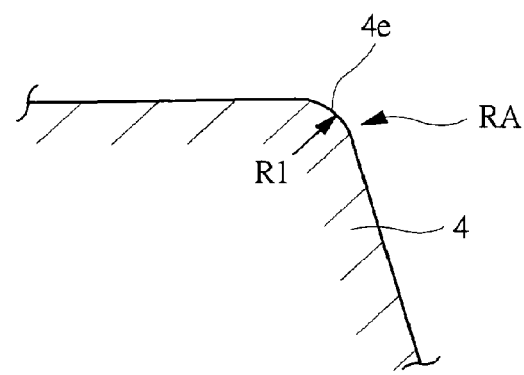
FIG. 5 is a partially enlarged cross-sectional view showing a structure of the RA part in FIG. 1.
Figure 6:
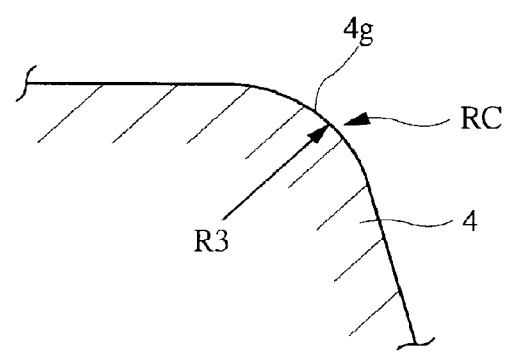
FIG. 6 is a partially enlarged cross-sectional view showing a structure of the RC part in FIG. 1.

FIG. 1 is a plan view showing a structure of the semiconductor device in accordance with the embodiment 1 of the present invention. FIG. 2 is a back view showing a structure of the semiconductor device shown in FIG. 1. FIG. 3 is a cross-sectional view showing a structure cut along the A-A line in FIG. 1. FIG. 4 is a partially enlarged cross-sectional view showing a structure of the RB part in FIG. 1. FIG. 5 is a partially enlarged cross-sectional view showing a structure of the RA part in FIG. 1. FIG. 6 is a partially enlarged cross-sectional view showing a structure of the RC part in FIG. 1.

The semiconductor device in accordance with the embodiment 1 in FIGS. 1 to 3 is a substrate semiconductor package in which a semiconductor chip 1 mounted on an upper surface 2a of a wiring substrate 2 is sealed with resin by a sealing body 4 and is electrically connected to the wiring substrate 2 via a wire (electroconductive wire) 7. The semiconductor chip 1 is mounted on the wiring substrate 2 and is connected to the wiring substrate 2 via a wire 7. The resin sealing body 4 seals the semiconductor chip 1 and wires 7.

In the embodiment 1, as a substrate semiconductor device, a BGA 9 with solder balls 5, which are external terminals, aligned on a lower surface 2b of the wiring substrate 2 in a grid pattern as shown in FIG. 2, is explained.

The semiconductor chip 1 mounted on the BGA 9 incorporates a semiconductor integrated circuit. As shown in FIG. 3, the semiconductor chip 1 is adhered to the upper surface 2a of the wiring substrate 2 by a die bonding member 6 such as a resin paste member. Electrode pads is are formed on a main surface 1a of the semiconductor chip 1. Wires 7 electrically connect these electrode pads and bonding leads 2c, which are ones of the wiring substrate 2 (see FIG. 8).

Accordingly, the electrode pads 1c are connected to the solder balls 5, which are external terminals of the BGA 9, via the wire 7, the bonding lead 2c, and the wiring parts of wiring substrate 2.

In this example, the semiconductor chip 1 is formed by silicon. In this example, the wire 7 is a gold or copper wire. The wire 7 has a diameter of φ20 µm or less. The sealing resin 3 (see FIG. 17), which is a resin for forming the sealing body 4, is a thermosetting epoxy resin. The external terminal is the solder ball 5 using a solder member.

The BGA 9 is a semiconductor package assembled by resin molding using transfer molding in the molding (sealing) of the assembling process.

Figure 11:
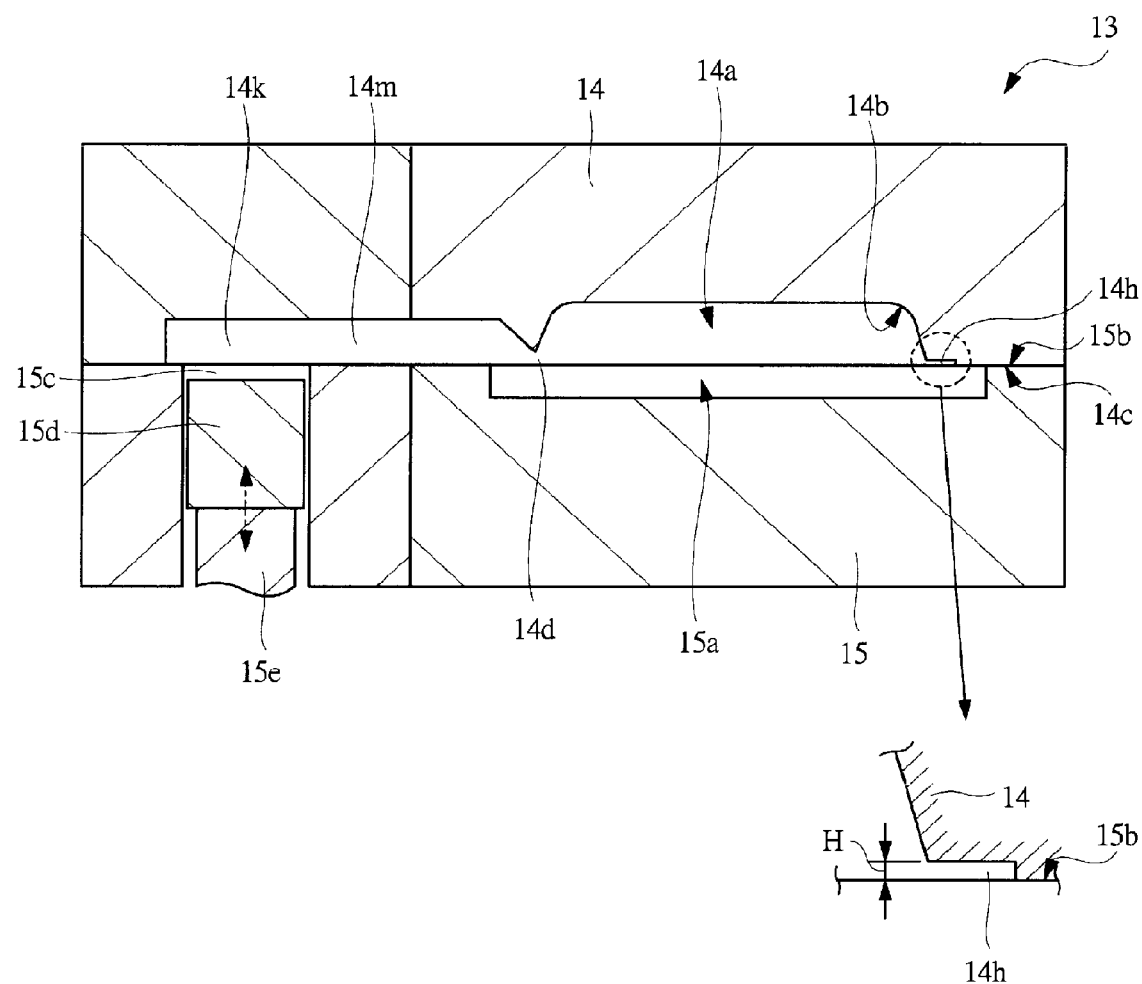
FIG. 11 is a partial cross-sectional view and a partially enlarged cross-sectional view showing a structure of a resin molding die used in the molding of the assembling process in FIG. 7.

The sealing body 4 has a shape corresponding to the cavity 14a of the resin molding die 13 in FIG. 11 used in the molding. The upper surface 4a of the sealing body 4, each of its adjacent side surfaces, and each edge part including the upper surface 4a and each of its adjacent side surfaces have shapes corresponding to shapes of each place (each corner part and each inner peripheral surface) of the cavity 14a.

The sealing body 4 has a gate resin 4i and an air vent resin 4j in FIG. 3. These resins are formed when the sealing resin 3 remains in the injection gate 14d and the air vent 14h of the resin molding die 13.

A second edge part 4f (an RB part), which includes the first side surface 4b and the upper surface 4a arranged at an angle part 4h facing the gate resin as shown in FIG. 1, has a curved cross section having a radius R2 as shown in FIG. 4. A first edge part 4e (an RA part), which includes a first side surface 4b and a second side surface 4c adjacent to the first side surface 4b as shown in FIG. 1, has a curved cross section having a radius R1 as shown in FIG. 5. A third edge part 4g (an RC part), which includes the second side surface 4c and the upper surface 4a as shown in FIG. 1 has a curved cross section having a radius R3 as shown in FIG. 6. The first edge parts 4e, the second edge part 4f, and the third edge part 4g have shapes corresponding to the shapes of the corner parts of the cavity 14a.

The cross sections of the edge parts (the second edge part 4f and the third edge part 4g) in FIGS. 4 and 6 are obtained by cutting the sealing body 4 in a direction along the height of BGA 9. The cross sections of the first edge part 4e in FIG. 5 is obtained by cutting the sealing body 4 along a crossing direction of the height of the BGA 9.

In the BGA 9 of the embodiment 1, the radius R2 of the cross section of the second edge part 4f is longer than the radius R1 of that of the first edge part 4e (the radius R2>the radius R1). The radius R3 of the cross section of the third edge part 4g is longer than the radius R1 of that of the first edge part 4e (the radius R3>the radius R1). The radius R2 of the cross section of the second edge part 4f has the same radius as the radius R3 of that of the third edge part 4g (the radius R2=the radius R3).

The sealing body 4 in FIG. 1 has the third side surface 4d formed on a position corresponding to the one over the injection gate 14d of the resin molding die 13 in FIG. 11. The gate resin 4i projects from the third side surface 4d. The first side surface 4b facing the third side surface 4d is a side surface formed at the angle part 4h which is farthest from the gate resin 4i.

The sealing body 4 has the third side surface 4d which is adjacent to the second side surface 4c and the upper surface 4a, which are adjacent to the first side surface 4b, and faces the first side surface 4b. The third side surface 4d is formed over the injection gate 14d of the resin molding die 13.

In a planar view of the sealing body 4 in FIG. 1, fourth side surfaces 4k are formed on two of the four angle parts 4h (not on the first side surface 4b and the third side surface 4d). The fourth side surfaces 4k face each other.

The air vent resin 4j projects from the first side surface 4b and the two fourth side surfaces 4k.

In a planar view of the sealing body 4, the four side surfaces between the angle parts 4h are the second side surfaces 4c. The two side surfaces between the first side surface 4b and the fourth side surface 4k are the second side surfaces 4c. So are the two side surfaces between the third side surface 4d and the fourth side surface 4k.

Among four edge parts having the second side surface 4c and the upper surface 4a, the edge parts (the RE part, the RG part, and the RI part) other than the third edge part 4g (the RC part) have the same cross section as that of the third edge part 4g with the radius R3 in FIG. 6. Each of the curved planes of the cross sections has the radius R3.

The edge parts for the upper surfaces 4a of the four angle parts 4h (the RD part, the RF part, and the RH part) other than the second edge part 4f (the RB part) have the same cross section as that of the second edge part 4f with the radius R2 in FIG. 4. Each of the curved planes of the cross sections has the radius R2.

The edge parts for side surfaces of four angle parts 4h (an RK part, an RL part, an RM part, an RN part, an RP part, an RQ part, and an RJ part) other than the first edge part 4e (RA part) have the same cross section as that of the first edge part 4e with the radius R1 in FIG. 5. Each of the curved planes of the cross sections has the radius R1.

As described above, the eight edge parts (the RB part, the RD part, the RF part, the RH part, the RC part, the RE part, the RG part, and the RI part) relating to the upper surface 4a in the sealing body 4 have a cross section with the radius R2 in FIG. 4 or the radius R3 in FIG. 6. The eight edge parts (the RA part, the RK part, the RL part, the RM part, the RN part, the RP part, the RQ part, and the RJ part) relating to the side surface have a cross section with the radius R1 in FIG. 5. The radius R2 is as long as the radius R3. They are longer than the radius R1 (R2=R3>1).

Next, the manufacturing method of the BGA (semiconductor device) 9 of the embodiment 1 is explained.

Figure 7:
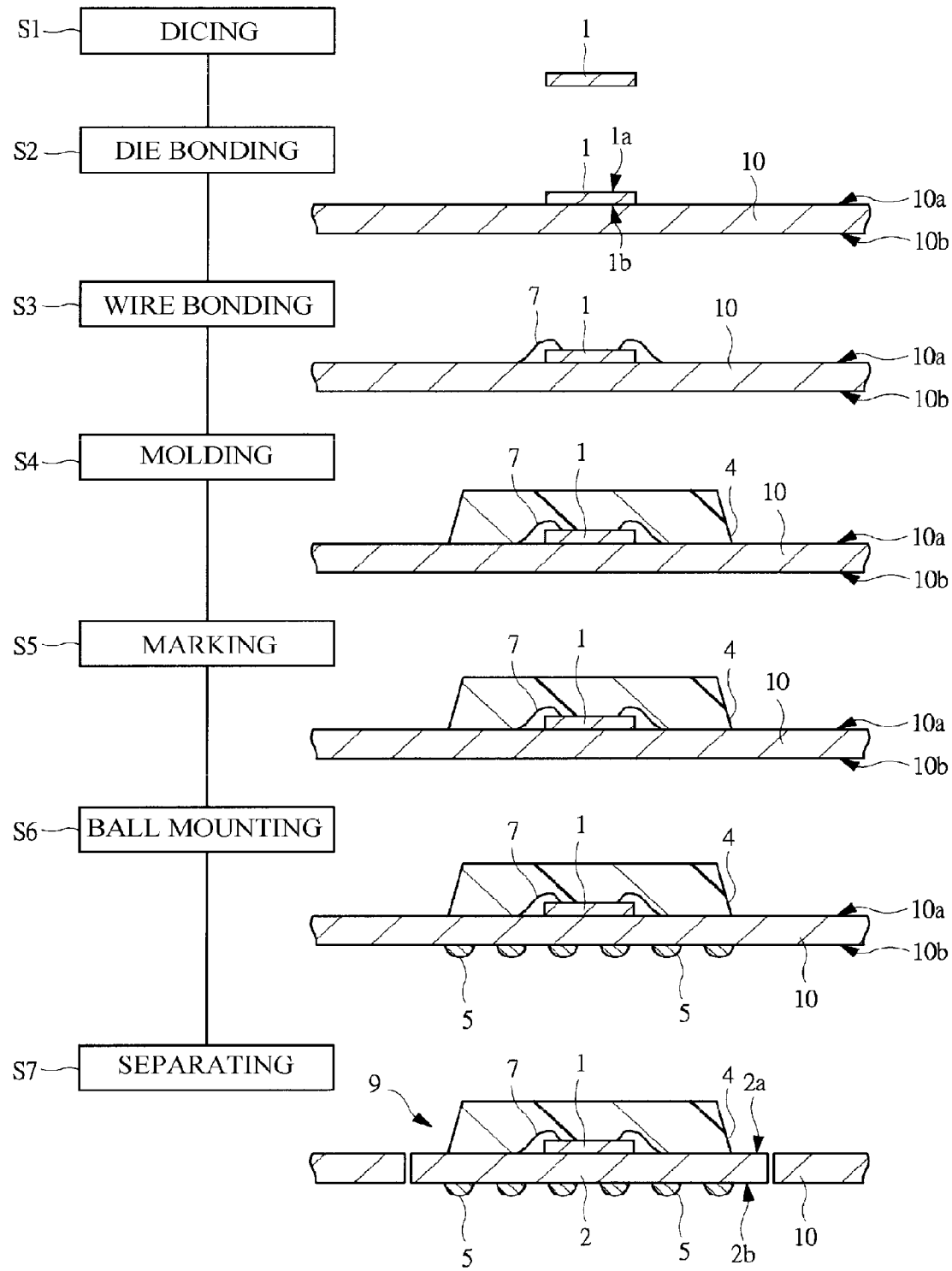
FIG. 7 is a flowchart showing an assembling process of the semiconductor device in FIG. 1.
Figure 8:
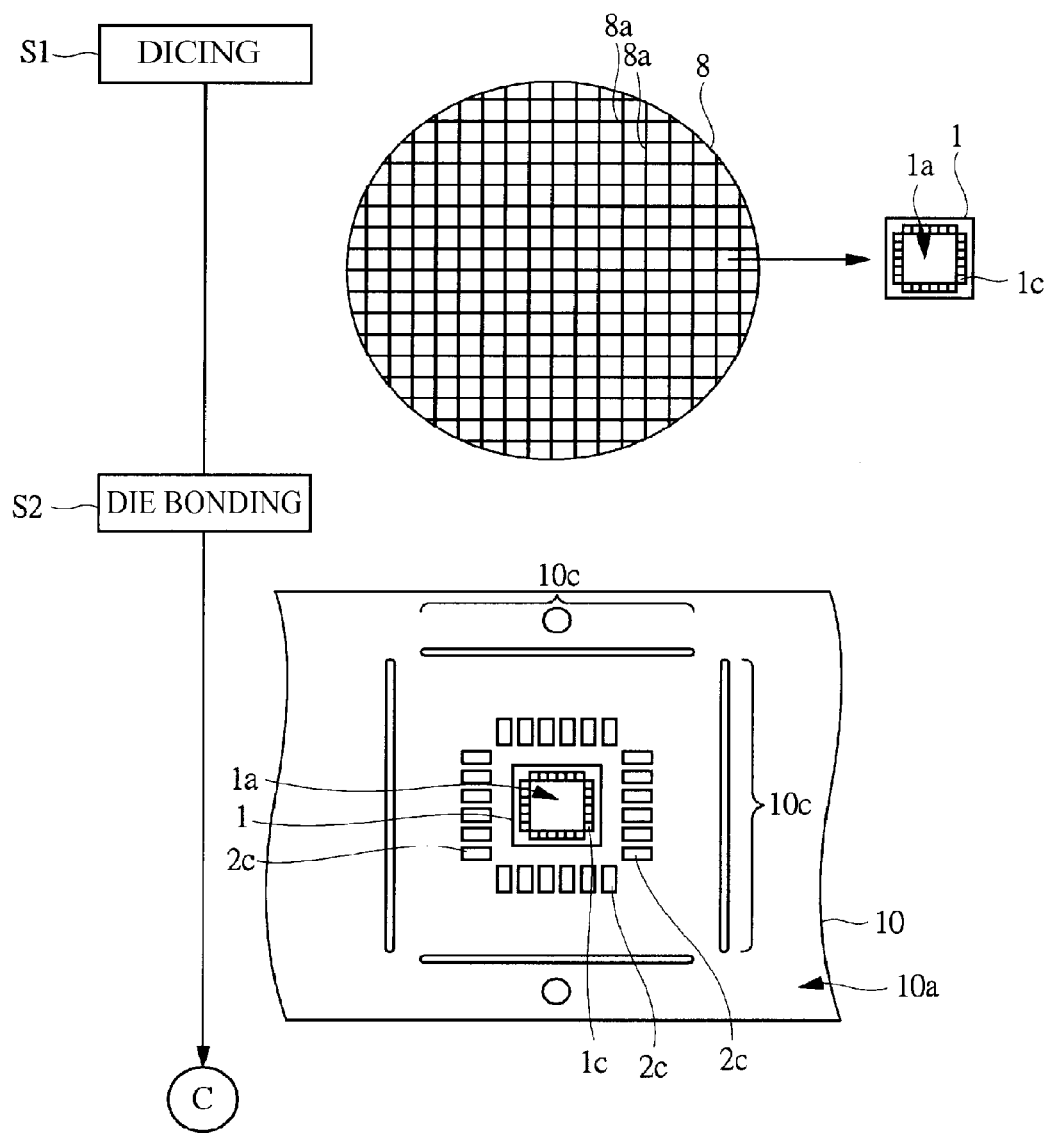
FIG. 8 is a plan view showing the assembling process from dicing to die bonding in FIG. 7.
Figure 9:
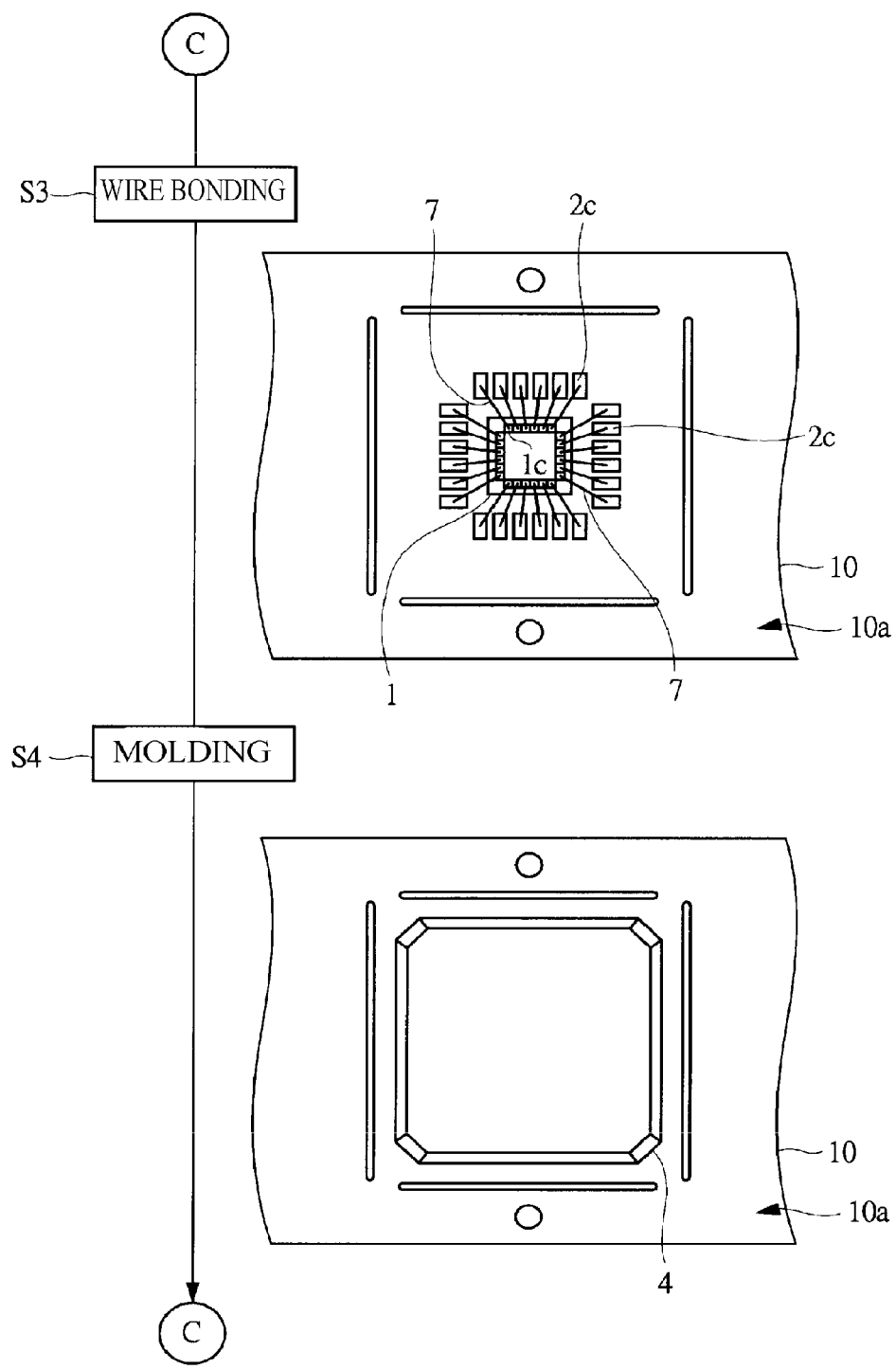
FIG. 9 is a plan view showing the assembling process from wire bonding to molding in FIG. 7.
Figure 10:
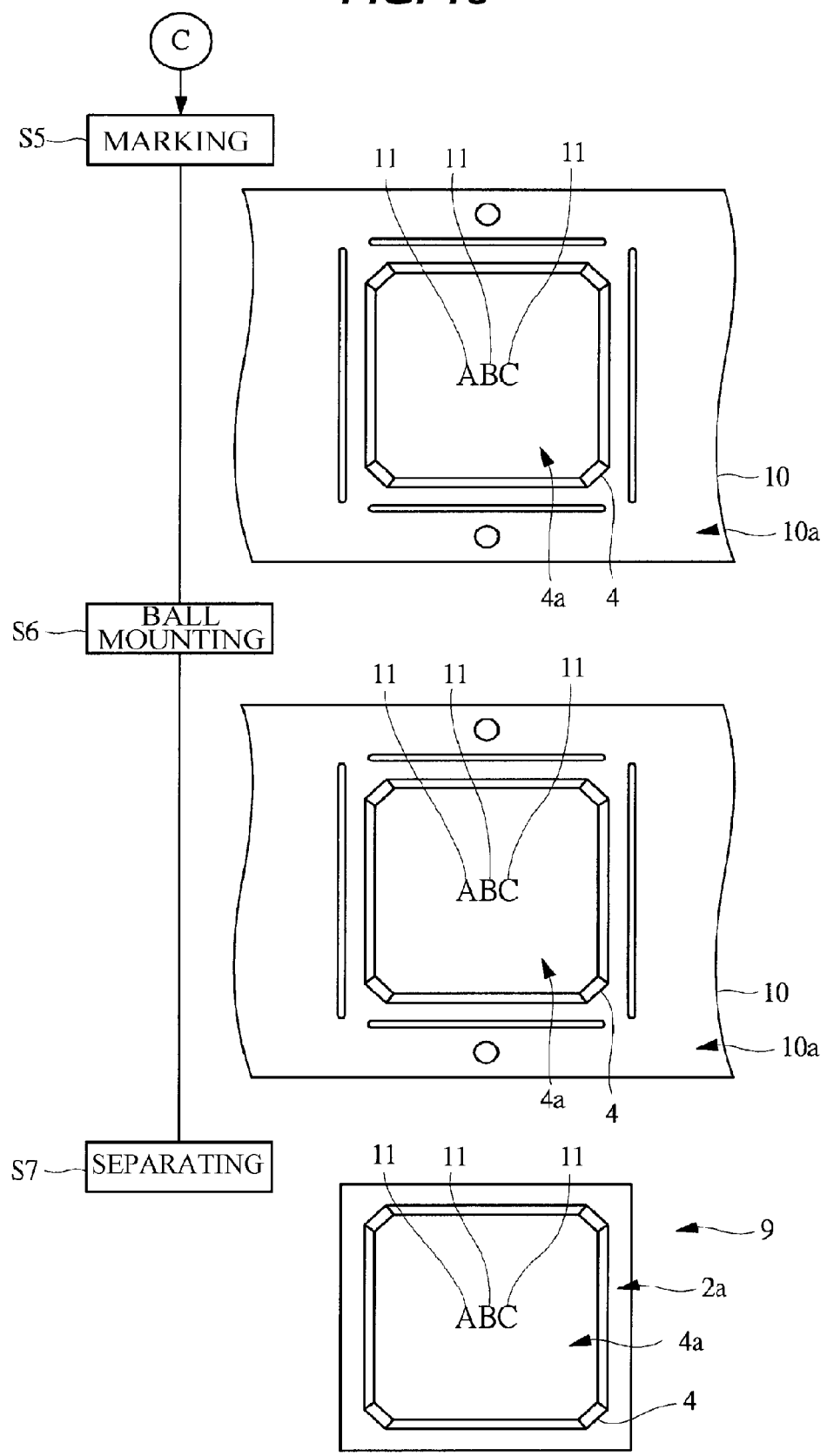
FIG. 10 is a plan view showing the assembling process from marking to singulating in FIG. 7.

FIG. 7 is a flowchart showing an assembling process of the semiconductor device in FIG. 1. FIG. 8 is a plan view showing the assembling process from dicing to die bonding in FIG. 7. FIG. 9 is a plan view showing the assembling process from wire bonding to molding in FIG. 7. FIG. 10 is a plan view showing the assembling process from marking to singulating in FIG. 7.

First, dicing shown at Step S1 in FIGS. 7 and 8 is performed. As shown in FIG. 8, cutting is performed along dicing line 8a of a semiconductor wafer 8. Then, semiconductor chips 1 with good quality are selected and obtained.

After that, die bonding shown at Step S2 in FIGS. 7 and 8 is performed.

First, a plural piece substrate 10, which is a plate-shaped member having multiple device regions 10c in FIG. 8 is prepared. Then, semiconductor chips 1 having electrode pads 1c formed on each main surface 1a are mounted on multiple device regions 10c of the upper surface 10a of the multiple piece substrate. The semiconductor chip 1 is adhered to the plural piece substrate 10 via the die bonding member 6 in FIG. 3 such as a resin paste member.

After that, wire bonding shown at Step S3 in FIGS. 7 and 9 is performed. Plural electrode pads is of the semiconductor chip 1 are electrically connected with plural bonding leads 2c of the plural piece substrate 10 with the wire 7, which is an electroconductive wire. A gold wire is used. It is thin and has a diameter of ϕ20 μM or less.

After the wire bonding, molding shown at Step S4 in FIGS. 7 and 9 is performed. In the molding of the embodiment 1, resin sealing by a transfer molding method is explained. Resin sealing is performed by the transfer molding method in the plural piece substrate 10 in which the electrode pad 1c of the semiconductor chip 1 is connected electrically with the bonding lead 2c of the device region 10c by the wire bonding.

The structure of the resin molding die used in the molding in accordance with the embodiment 1 is explained.

Figure 12:
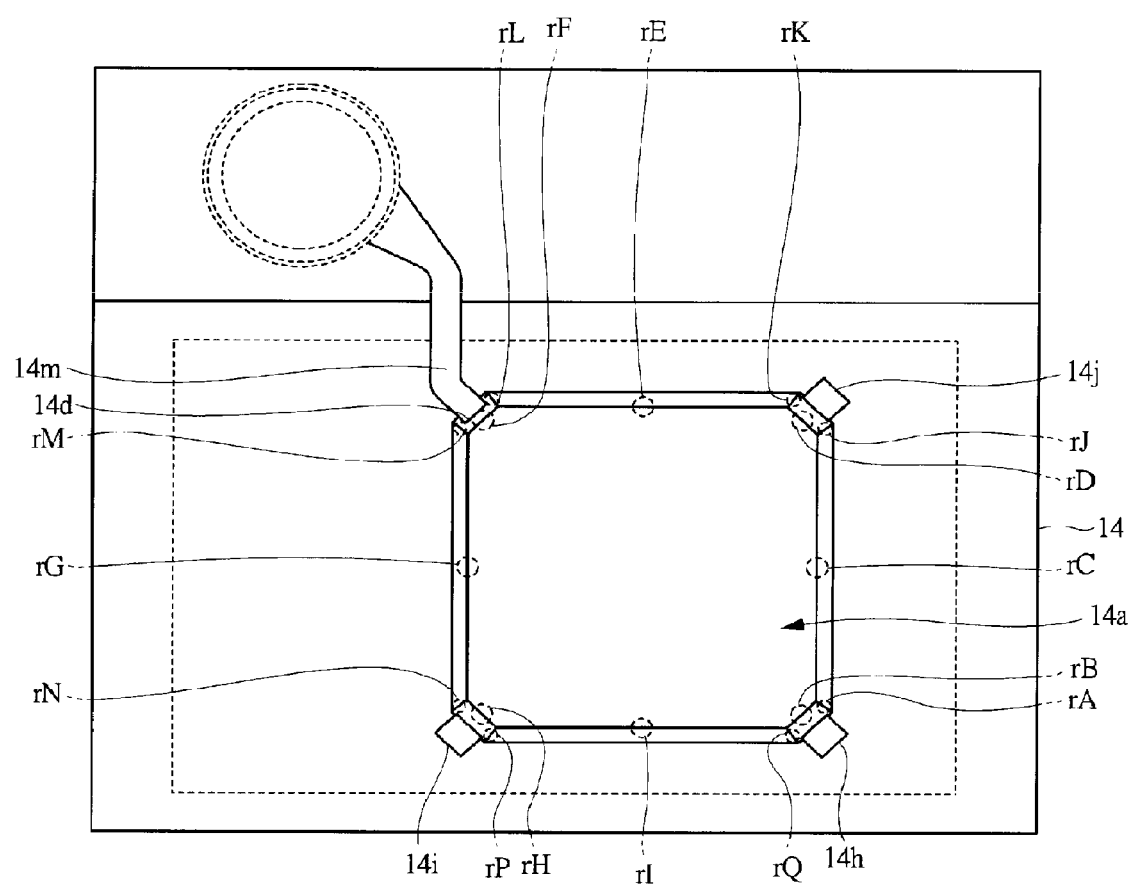
FIG. 12 is a transparent plan view showing a structure of a runner and a cavity in the upper die of the resin molding die in FIG. 11.
Figure 13:
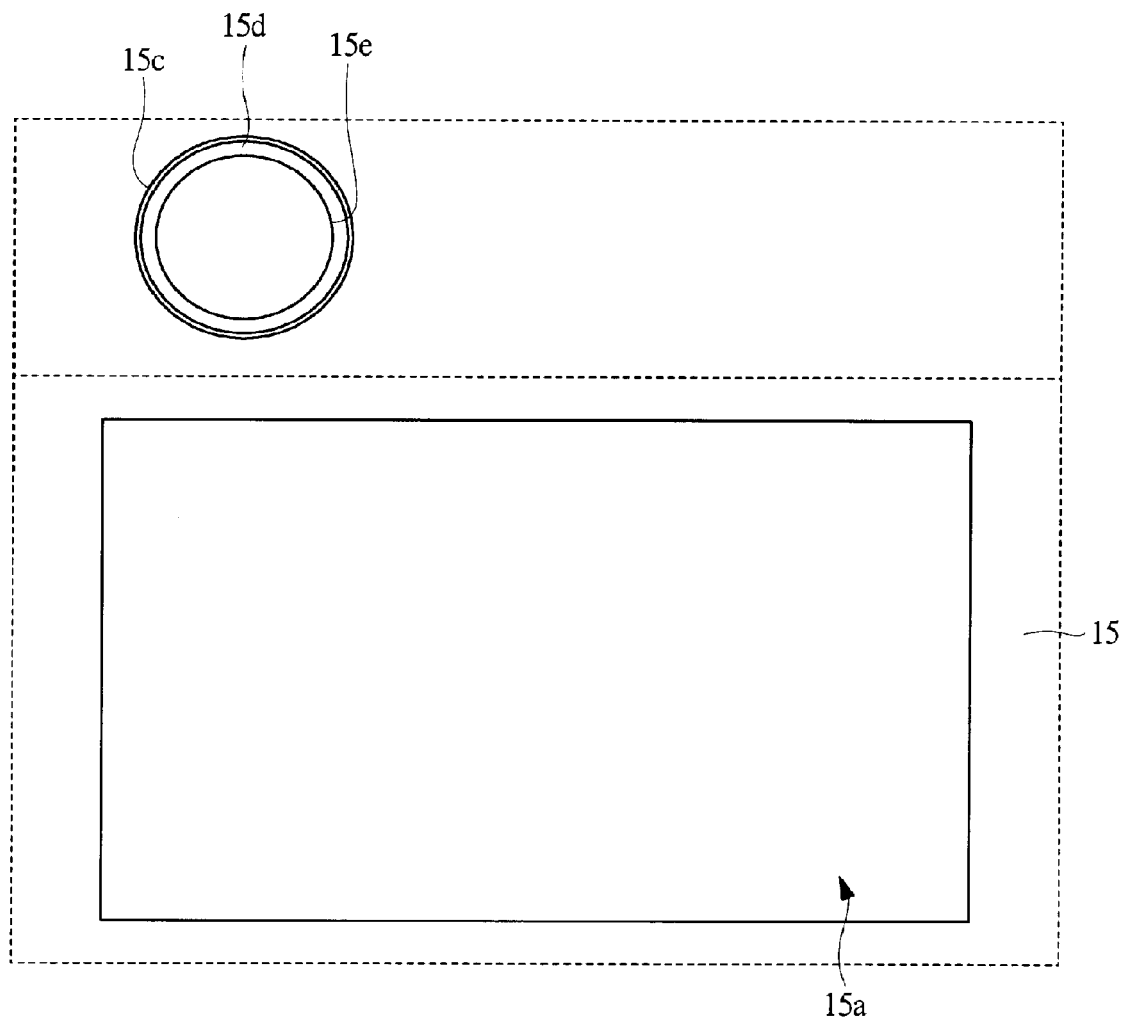
FIG. 13 is a plan view showing a structure of the lower die of the resin molding die in FIG. 11.
Figure 14:
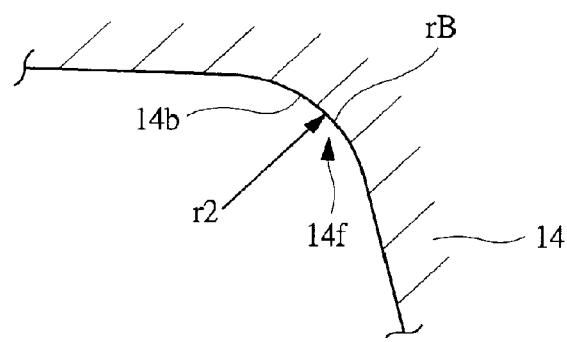
FIG. 14 is a partially enlarged cross-sectional view showing a structure of the rB part in FIG. 12.
Figure 15:
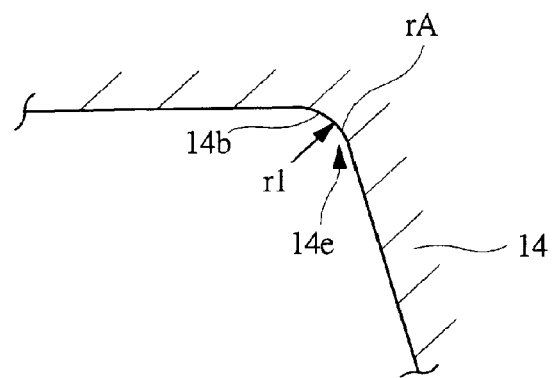
FIG. 15 is a partially enlarged cross-sectional view showing a structure of the rA part in FIG. 12.
Figure 16:
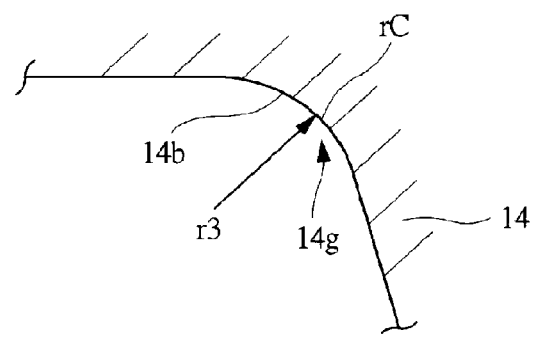
FIG. 16 is a partially enlarged cross-sectional view showing a structure of the rC part in FIG. 12.
Figure 17:
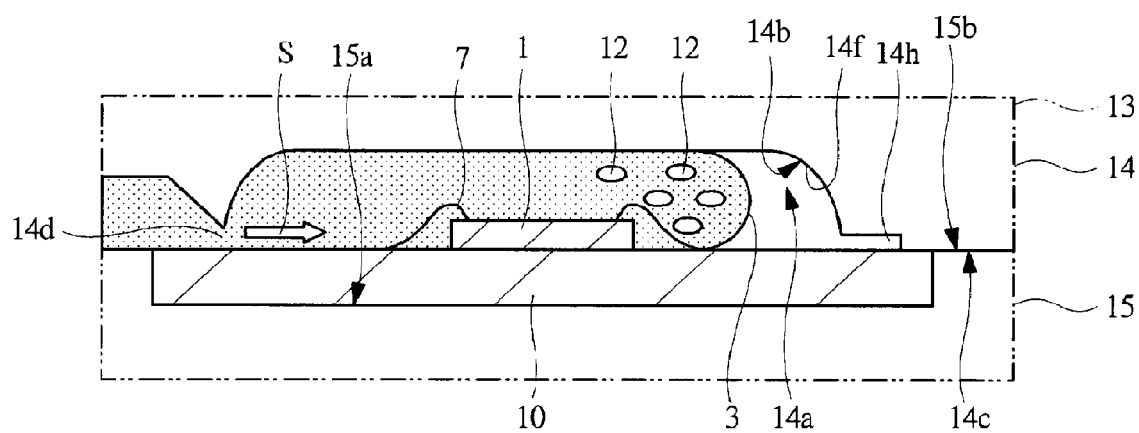
FIG. 17 is a partial cross-sectional view showing a resin flow state in the molding of the assembling process in FIG. 7.
Figure 18:
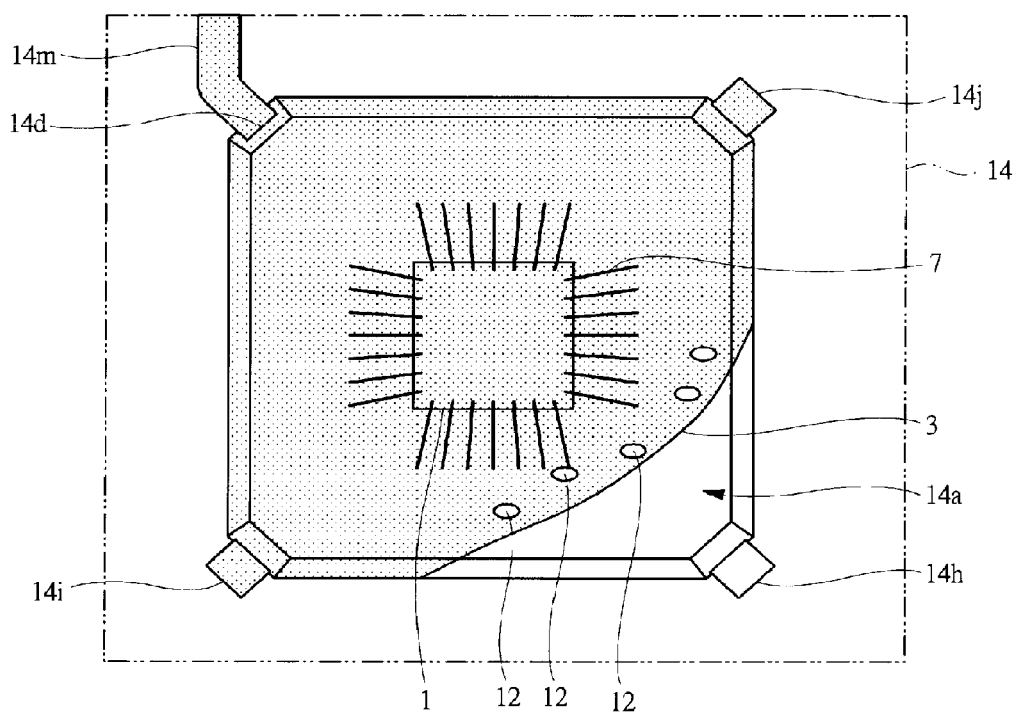
FIG. 18 is a partial plan view showing the resin flow state in FIG. 17.
Figure 19:
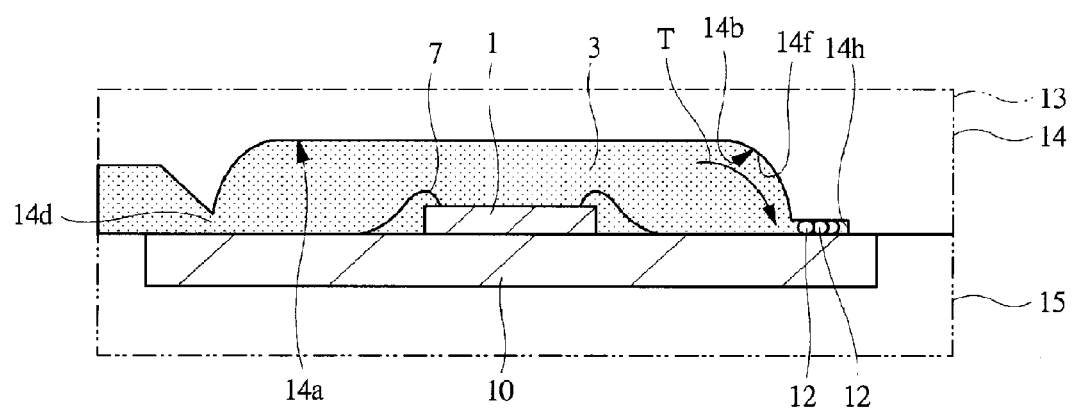
FIG. 19 is a partial cross-sectional view showing a resin filling completion state in the molding of the assembling process in FIG. 7.
Figure 20:
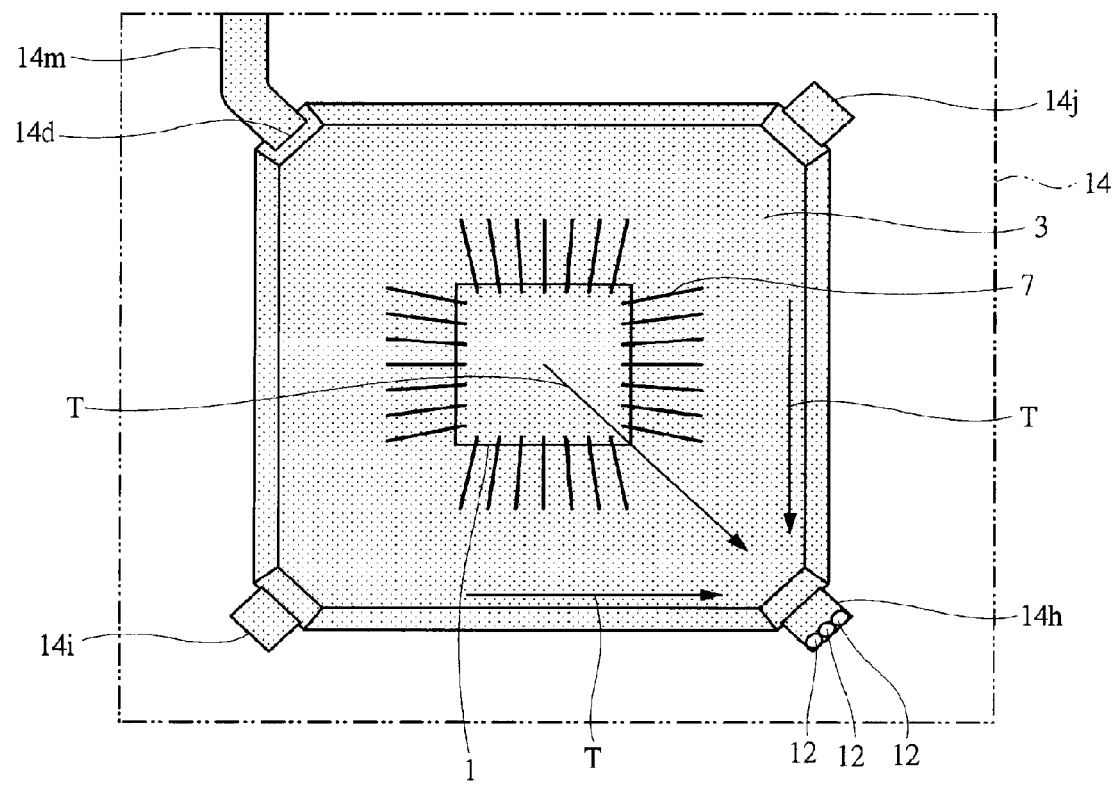
FIG. 20 is a partial plan view showing the resin filling completion state in FIG. 19.

FIG. 11 is a partial cross-sectional view and a partially enlarged cross-sectional view showing a structure of the resin molding die used in the molding of the assembling process in FIG. 7. FIG. 12 is a transparent plan view showing a structure of a runner and a cavity in the upper die of the resin molding die in FIG. 11. FIG. 13 is a plan view showing a structure of the lower die of the resin molding die in FIG. 11. FIG. 14 is a partially enlarged cross-sectional view showing a structure of the rB part in FIG. 12. FIG. 15 is partially enlarged cross-sectional view showing a structure of the rA part in FIG. 12. FIG. 16 is a partially enlarged cross-sectional view showing a structure of the rC part in FIG. 12. FIG. 17 is a partial cross-sectional view showing a resin flow state in the molding of the assembling process in FIG. 7. FIG. 18 is a partial plan view showing the resin flow state in FIG. 17. FIG. 19 is a partial cross-sectional view showing a resin filling completion state in the molding of the assembling process in FIG. 7. FIG. 20 is a partial plan view showing the resin filling completion state in FIG. 19.

The resin molding die 13 in FIG. 11 includes a pair of the upper die 14, which is a first die, and the lower die 15, which is a second die. In the resin filling, a mating face 14c of the upper die 14 and a mating face 15b of the lower die 15 are mated and clamped. After that, resin is supplied to the cavity 14a to perform the filling.

On the upper die 14, the cavity 14a for forming the sealing body 4 of the BGA 9 in FIG. 1 is formed. Furthermore, the injection gate 14d connected with the cavity 14a and the air vent 14h connected with the cavity 14a are formed. And, a cull 14k and a runner 14m to be a flow path of the resin are provided. The cull 14k, the runner 14m, the injection gate 14d, the cavity 14a, and the air vent 14h are connected with each other. The air vent 14h in FIG. 11 is an air outlet facing the injection gate 14d. As shown in FIG. 12, on other two corners in the plan view of the cavity 14a, an air vent 14i and an air vent 14j connected with the cavity 14a are formed.

FIG. 12 shows shapes of the runner 14m, the injection gate 14d, the cavity 14a and air vents 14h, 14i and 14j, seen through the upper die 14 in FIG. 11 from the above.

As shown in FIGS. 11 and 13, a concave substrate mounting part 15a for arranging the substrate and a pot 15c are formed on the lower die 15. A plunger head 15d and a plunger rod 15e for pushing out the resin are arranged in the pot 15c.

Next, a detailed shape of the cavity 14a of the upper die 14 is explained.

In the upper die 14, the size of the radius of the cross section of the inner peripheral surface 14b (inner peripheral surface 14b (size of curvature radius of curved plane)) of the corner parts of the cavity 14a is characterized.

In FIG. 12, a first corner part 14e (rA) of the cavity 14a forming a first edge part 4e (including first side surface 4b and second side surface 4c) of the sealing body 4 in FIG. 1 at a position corresponding to the air vent 14h which is farthest from the injection gate 14d of the upper die 14 is formed, as shown in FIG. 15, so that the cross section, of the inner peripheral surface 14b has a radius of r1. A second corner part 14f (rB) of the cavity 14a in FIG. 12 forming the second edge part 4f (including first side surface 4b and upper surface 4a) of the sealing body 4 shown in FIG. 1 is formed so that the cross section of the inner peripheral surface 14b has a radius of r2 as shown in FIG. 14. The radius r2 of the cross section of the second corner part 14f of the cavity 14a is longer than the radius r1 of that of the first corner part 14e (r2>r1).

Furthermore, a third corner part 14g (rC) of the cavity 14a in FIG. 12 forming the third edge part 4g (including the second side surface 4c and upper surface 4a) of the sealing body 4 shown in FIG. 1 is formed so that the cross section of the inner peripheral surface 14b has a radius of r3 as shown in FIG. 16. The radius r3 of the cross section of the third corner part 14g of the cavity 14a is formed, as is the case for the second edge part 4f, longer than the radius r1 of that of the first corner part 14e (r3>r1).

The radius r2 of the cross section of the second corner part 14f is the same as the radius r3 of that of the third corner part 14g (r2=r3).

In the cavity 14a in FIG. 12, all cross sections of the inner peripheral surface 14b of the corner parts (the rB part, the rC part, the rD part, the rE part, the rF part, the rG part, the rH part, and the rI part) of the cavity 14a forming edge parts including respective side surfaces and upper surfaces 4a of the sealing body 4 shown in FIG. 1 are formed with the size of the radius r2 shown in FIG. 14 (also may be the radius r3 in FIG. 16).

Further, in the cavity 14a in FIG. 12, all cross sections of the inner peripheral surface 14b of corner parts (the rA part, the rJ part, the rK part, the rL part, the rM part, the rN part, the rP part, and the rQ part) of the cavity 14a forming edge parts including side surfaces of the sealing body 4 in FIG. 1 are formed with the radius r1 shown in FIG. 15 (r1<r2).

In the cavity 14a, the reason why the radius r1 of cross sections of inner peripheral surfaces 14b of the corner parts (the rA part, the rJ part, the rK part, the rL part, the rM part, the rN part, the rP part, and the rQ part) of the cavity 14a forming the edge parts including the side surfaces (the edge parts in which adjacent side surfaces cross each other) is shorter than the radius r2 is to keep air vents 14h, 14i and 14j. When a radius r of the cross section of the inner peripheral surface 14b of the corner part of the cavity 14a forming the edge part including side surfaces arranged for the angle part 4h of the sealing body 4 is long, because the area of the side surface (for example, first side surface 4b) of the angle part 4h of the sealing body 4 is small, the side surface becomes a curved plane not to allow the air vents, to be formed at the corner part of the cavity 14a.

Accordingly, by shortening the radius r1 than the radius r2 (r1<r2), air vents 14h, 14i and 14j can be formed at the corner parts other than the corner part arranged with the injection gate 14d of the cavity 14a.

In the cavity 14a, the radius r2 of the cross section of the inner peripheral surface 14b of the second corner part 14f of the corner part which is farthest from the injection gate 14d should preferably be 0.5 mm or more.

In the second corner part 14f of the cavity 14a, the radius r2 of the cross section of the inner peripheral surface 14b was set to be 0.25, 0.45, 0.60, or 0.75 to investigate the rate of void occurrence. The rate of void occurrence was 1% only when r2 is 0.25. It was 0% in other cases. Due to this reason, the radius r2 should preferably be set to be 0.5 mm or more in consideration of variation in mass production.

In the molding of the embodiment 1, the resin sealing is performed by using a high-fluidity resin as the sealing resin 3. In the assembling of the BGA 9, a gold wire (wire 7) with a thickness f $\phi$20 μm or less is used for the cost reduction. Since the wire displacement occurs easily in the resin filling in the molding, the high-fluidity resin is adopted as the sealing resin 3 to reduce the wire displacement.

The following explains the definition of the high-fluidity resin to be adopted as the sealing resin 3 in the molding in accordance with of the embodiment 1. The high-fluidity resin preferably has a spiral flow of 100 cm or more, which represents the properties of the resin.

The spiral flow shows the arrival length (flow length) of the resin in the groove when a resin is filled into a test die provided with a groove in a spiral shape (eddy shape) under a definite condition. The larger (longer) the numerical value of the spiral flow, the higher the fluidity of the resin. Accordingly, the spiral flow can evaluate the fluidity of the resin in injection molding.

In the measurement of the spiral flow, a die and an injection molding machine prescribed in EMMI-1-66 are used as a measuring apparatus. The sample to be measured is taken out of a reserving chamber, left in a sealed state under room temperature for two hours. Then, the sample is unsealed to be measured. The test is completed within two hours after the unsealing.

As the measurement condition, the quantity of the sample is 15g, and the cull thickness is about 3 mm. The injection pressure is 6.9±0.5 Mpa. The molding time is 120±5 seconds without carrying out preheat. The temperature is 175±2° C. Under these conditions, the temperature reaches the prescribed level. Then, the sample is embedded and the plunger is let down rapidly to start pressurization within 10 seconds.

Then, the spiral flow can be measured by disassembling the die after the lapse of the prescribed time and reading the flow length (cm) of the resin.

Ordinary resins have the spiral flow of around 90 cm. But, the embodiment 1 adopts a high-fluidity resin having a spiral flow of 100 cm or more as the sealing resin 3. This can prevent the wire displacement even when the diameter of the wire 7 is $\phi$20 μm or less.

When the high-fluidity resin as described above is used, the resin enters the air vents adjacent to the cavity 14a in the resin filling. Then, the resin burr tends to occur.

Accordingly, to minimize such the occurrence of resin burr, in the embodiment 1, as shown in FIG. 11, the height H of the opening of the air vent 14h (the same for air vents 14i, 14j shown in FIG. 12) of the resin molding die 13 used in the molding process is changed from conventional value (around 40 μm) to around 30 μm.

As described above, setting the opening height of the air vent 14h to around 30 μm can minimize the occurrence of resin burr when the high-fluidity resin is used.

Next, the following explains the resin sealing method in accordance with the embodiment 1 in detail.

First, as shown in FIG. 17, the plural piece substrate 10 mounted with the semiconductor chip 1 is sent between the upper die 14 and the lower die 15. Then, the plural piece substrate 10 is arranged in the concave substrate mounting part 15a of the lower die 15.

After that, the dies are clamped so that the mating surface 14c of the upper die 14 and the mating surface 15b of the lower die 15 are mated, and, in the state where the semiconductor chip 1 is covered with the cavity 14a of the upper die 14, as shown in FIGS. 17 and 18, the sealing resin 3 is injected into the cavity 14a from the injection gate 14d with an injection pressure S. The sealing resin 3 heated and melted in the pot 15c of the lower die 15 shown in FIG. 13 is pushed out by the plunger head 15d to be fed to the cavity 14a.

The sealing resin 3 used is the described high-fluidity resin.

The sealing resin 3 pushed out into the cavity 14a via the injection gate 14d proceeds toward the air vent 14h facing the injection gate 14d, while dispersing in a radial pattern with plural voids (air bubbles) 12 contained in the resin.

Since the radius r2 of the cross section of the inner peripheral surface 14b of the corner part (second corner part 14f) corresponding to the air vent 14h which is farthest from the injection gate 14d of the cavity 14a is 0.5 mm or more, the void 12 does not remain in the second corner part 14f. The void 12 is transported to the corner part of the cavity 14a by a resin flow T in FIG. 19. Then, the void 12 is pushed out into the air vent 14h.

As a result, the sealing resin 3 can be filled as shown in FIG. 20 without the void 12 remained in the cavity 14a.

Consequently, the sealing body 4 shown in FIG. 1 is formed over the plural piece substrate 10. Since no void 12 remains in the cavity 14a, no void is formed on the surface of the sealing body 4 to cause no defective appearance.

Consequently, the molding shown at Step S4 in FIGS. 7 and 9 ends.

After the resin molding, the marking shown at Step S5 in FIGS. 7 and 10 is performed. As shown in FIG. 10, an intended mark 11 is marked on the surface of the sealing body 4.

After that, ball mounting shown at Step S6 in FIGS. 7 and 10 is performed. On the lower surfaces 10b side in FIG. 7 of plural device regions 10c of the plural piece substrate 10 in FIG. 10, plural solder balls 5, which are external terminals, are mounted. Reflow melts the solder balls 5. Then, the solder balls 5 are bonded electrically to the plural electrodes of the lower face 10b of the plural piece substrate 10.

After ball mounting, singulating shown at Step S7 in FIGS. 7 and 10 is performed. The plural piece substrate 10 is cut by dicing to be singulated into the individual BGA 9. Consequently, the assembling of the BGA 9 in FIGS. 1 to 3 ends.

According to the manufacturing method of the semiconductor device (BGA 9) in accordance with the embodiment 1, by lengthening the radius r2 of the cross section of the inner peripheral surface 14b of the corner part (second corner part 14f) facing the injection gate 14d of the cavity 14a, the void 12 contained in the resin can be pushed out into the air vent 14h in the injection, without the void remained in the corner part of the cavity 14a.

In the resin molding die 13, by lengthening the radius r2 of the cross section of the inner peripheral surface 14b of the corner part (second corner part 14f over air vent 14h facing injection gate 14d) which is farthest from the injection gate 14d of the cavity 14a more than the radius r1 of that of the inner peripheral surface 14b of the corner part (first corner part 14e) forming the edge part including side surfaces of the sealing body 4, the void 12 contained in the injection of the sealing resin 3 (high-fluidity resin) can be pushed out into air vents 14h, 14i and 14j, without the void remained in the corner parts of the cavity 14a, particularly in the second corner part 14f, too, which easily allows the void 12 to remain.

Consequently, the occurrence of the void 12 can be prevented in the cavity 14a. Then, the formation of the void can be prevented in the sealing body 4.

As a result, the occurrence of the appearance defect can be prevented in the BGA 9 (semiconductor device). Then, the yield of the BGA 9 improves.

Since the occurrence of the appearance defect of the BGA 9 can be prevented in the BGA 9, the yield of the BGA 9 can improve.

Moreover, by lengthening the radius r2 of the cross section of the inner peripheral surface 14b of the second corner part 14f over the air vent 14h which is farthest from the injection gate 14d of the cavity 14a more than the radius r1 of that of the first corner part 14e, which is the corner part of the cavity 14a forming the edge part including side surfaces of the sealing body 4, the mold-releasing properties when the sealing body 4 is released from the die can be improved.

Meanwhile, when the radius r1 of the first corner part 14e is longer (when the radius r1 is as long as the radius r2), the curved plane is large in the corner part of the cavity 14a and the formation of the air vents is difficult. But, in the embodiment 1, by shortening the radius r1 of the cross section of the inner peripheral surface 14b of the first corner part 14e more than the radius r2 of that of the second corner part 14f (radius r1<radius r2), the air vents can be formed.

And, by setting the radius r2 of the cross section of the inner peripheral surface 14b of the second corner part 14f over the air vent 14h which is farthest from the injection gate 14d of the cavity 14a to be the same length as the radius r3 of that of the third corner part 14g continued to the second corner part 14f, shaving with the same shaving blade becomes possible in forming the cavity 14a. Since this allows to perform the processing of the inner peripheral surface 14b continuously with the same shaving blade without changing the shaving blade, the time for fabricating the die can be shortened as compared with a case that the radius r2 and the radius r3 differ in size.

Since the semiconductor device in accordance with the embodiment 1 uses a thin gold wire with a diameter of ϕ20 μm or less, as compared with cases that a gold wire with a diameter of more than ϕ20 μm is used, the usage quantity of gold is reduced and the material cost can be reduced.

Regarding the use of a thin gold wire of ϕ20 μm or less as the wire 7, the wire displacement can reduce because a high-fluidity resin is adopted as the sealing resin 3.

Regarding the adoption of the mentioned high-fluidity resin as the sealing resin 3, the occurrence of the resin burr can be minimized because the opening height (H) of the air vents adjacent to the cavity 14a is around 30 μm.

Next, a modified embodiment 1 is explained.

Figure 21:
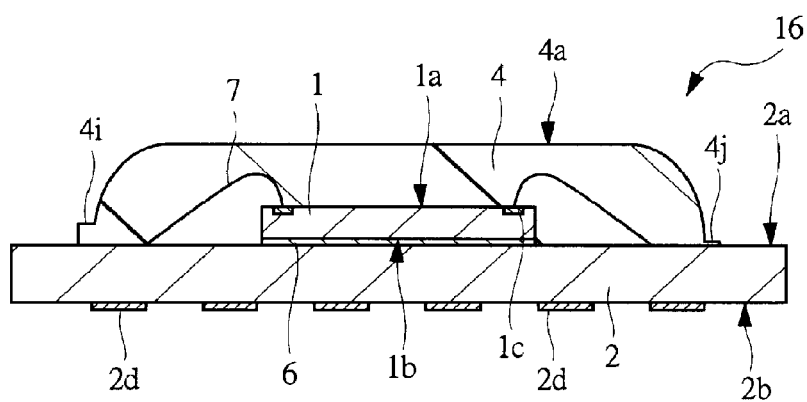
FIG. 21 is a cross-sectional view showing a modified structure of the semiconductor device in accordance with the embodiment 1 of the present invention.

FIG. 21 is a cross-sectional view showing the structure of a semiconductor device in accordance with the modified embodiment 1 of the present invention. In this example, the semiconductor device is an LGA (Land Grid Array) 16.

The LGA 16 is, like the BGA 9, a substrate semiconductor device mounted with the semiconductor chip 1 over the wiring substrate 2. Land terminals 2d to be external terminals are arranged in a grid pattern for a lower face 2b of the wiring substrate 2. In the LGA 16, too, the semiconductor chip 1 and plural wires 7 are sealed with resin by the sealing body 4. The forming method of the sealing body 4 is exactly the same as that of the sealing body 4 of the BGA 9.

In the molding of the assembling of the LGA 16, the resin sealing is performed by using the die shown in FIGS. 11 to 16. In the filling of the resin, states shown in FIGS. 17 to 20 allow to push out the void 12 contained in the resin into air vent without allowing the void to remain in corner parts of the cavity 14a.

Consequently, like in the BGA 9, the occurrence of the void 12 can be prevented in the cavity 14a. The formation of the void can be prevented in the sealing body 4.

As a result, the occurrence of the appearance defect of the LGA 16 (semiconductor device) can be prevented. The yield of the LGA 16 can improve. Moreover, the quality of the LGA 16 can improve because the occurrence of the appearance defect of the LGA 16 can be prevented.

Other effects given by the LGA 16 are the same as effects of the BGA 9. The repeated explanation is omitted.
(Embodiment 2)

Figure 22:
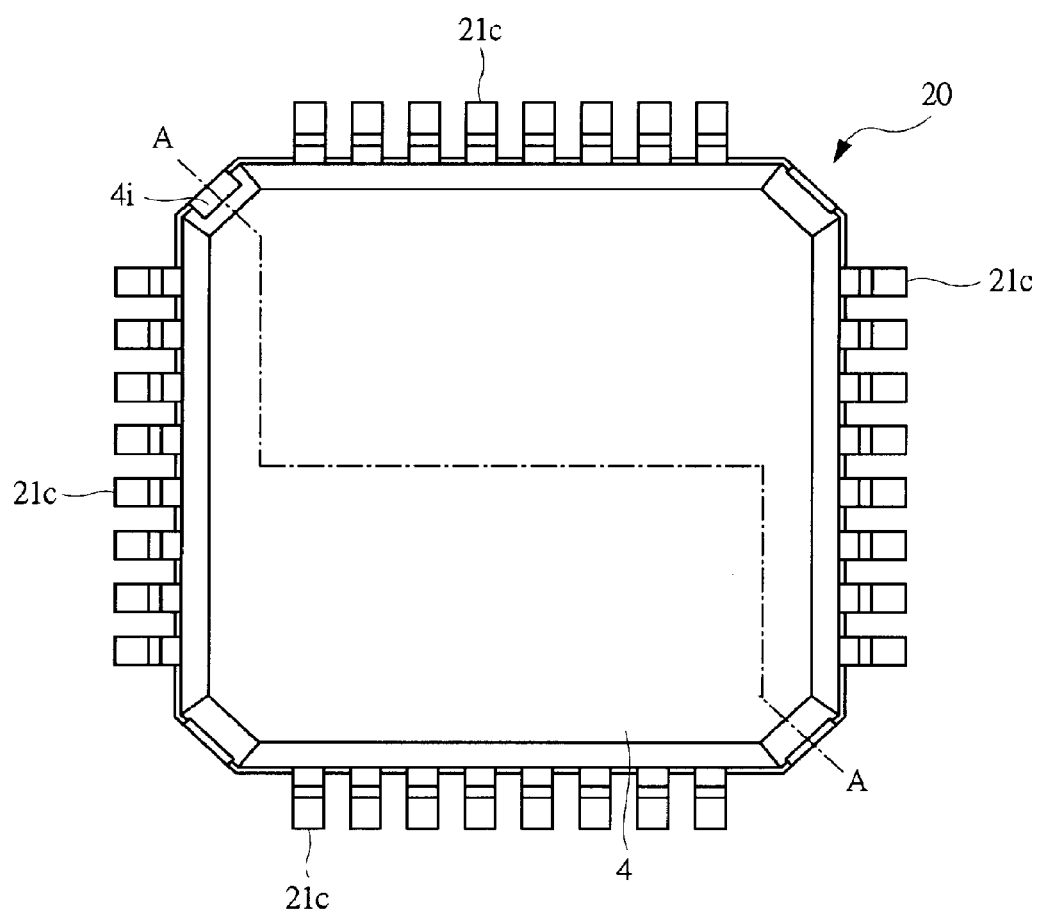
FIG. 22 is a plan view showing a modified structure of the semiconductor device of an embodiment 2 of the present invention.
Figure 23:
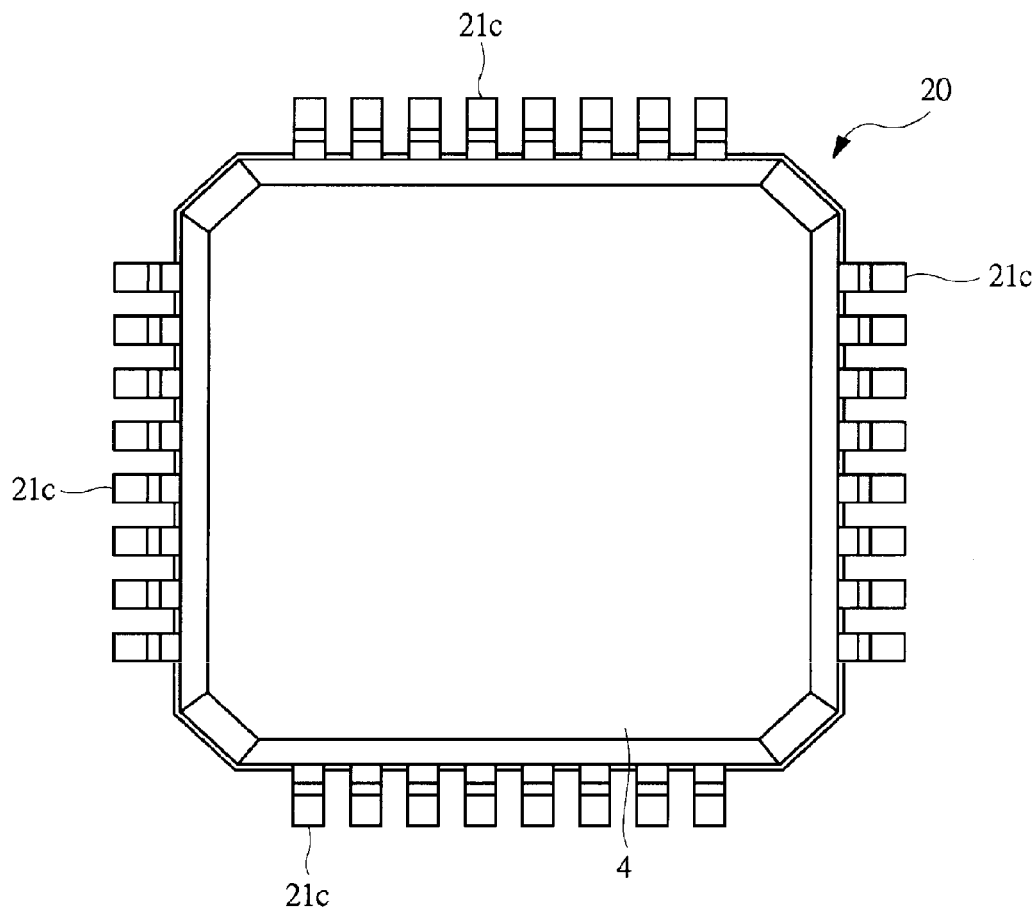
FIG. 23 is a back view showing a structure of the semiconductor device shown in FIG. 22.
Figure 24:
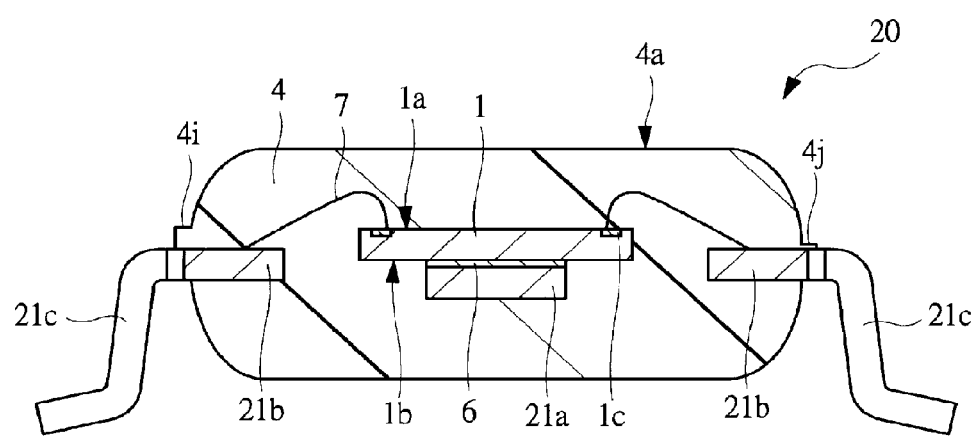
FIG. 24 is a cross-sectional view showing a structure cut along the A-A line in FIG. 22.
Figure 25:
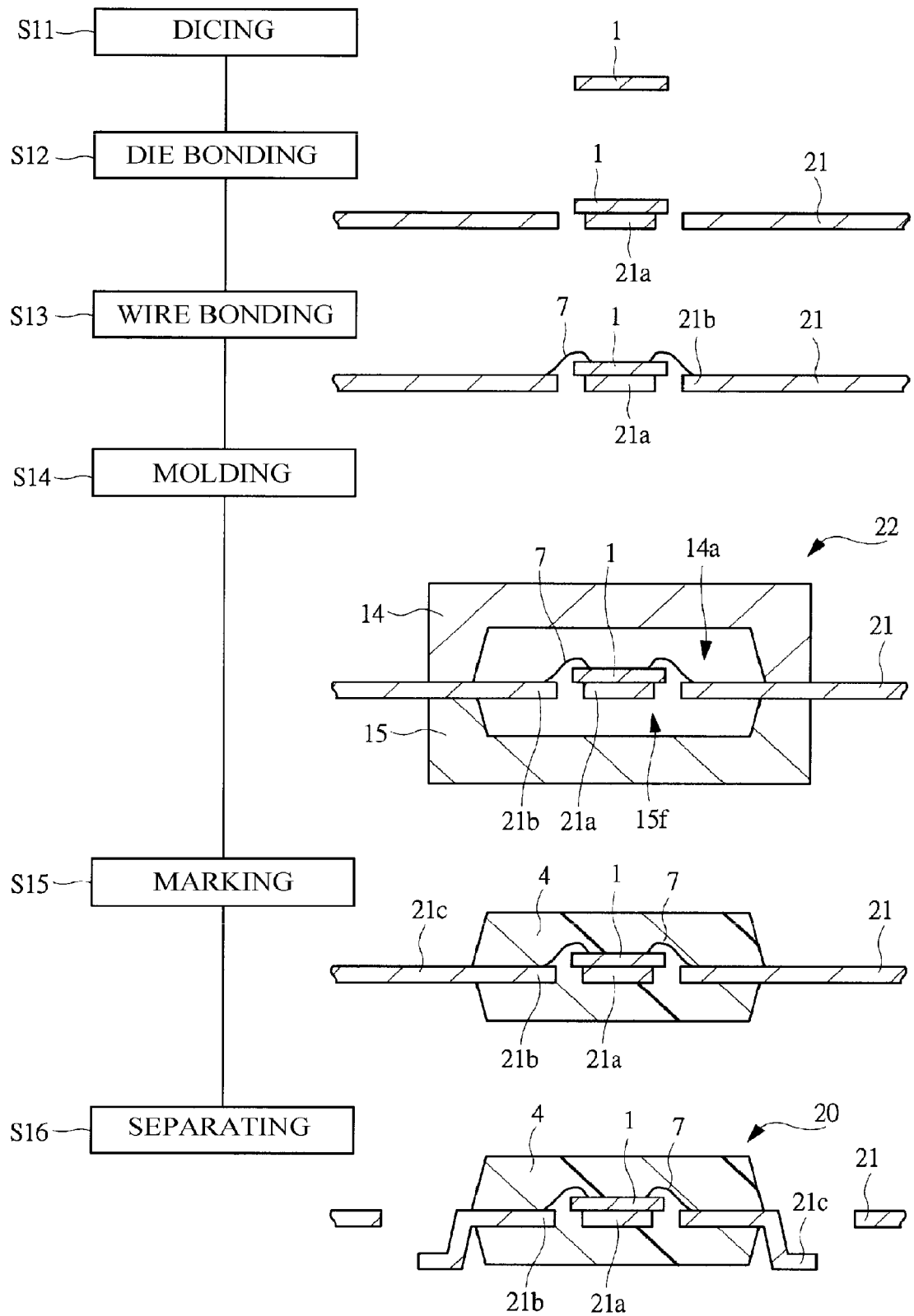
FIG. 25 is a flowchart showing an assembling process of the semiconductor device in FIG. 22.

FIG. 22 is a plan view showing a structure of the semiconductor device in accordance with an embodiment 2 of the present invention. FIG. 23 is a back view showing a structure of the semiconductor device in FIG. 22. FIG. 24 is a cross-sectional view showing a structure cut along the A-A line in FIG. 22. FIG. 25 is a flowchart showing an assembling process of the semiconductor device in FIG. 22.

The embodiment 2 explains a manufacturing method of a flame semiconductor device assembled by using a lead frame (plate-like member) 21 in FIG. 25. The embodiment 2 mentions picking up a QFP (Quad Flat Package) 20 with resin sealed.

The structure of the QFP 20 is explained using FIGS. 22 to 24. The QFP 20 has the semiconductor chip 1 in which a semiconductor integrated circuit is formed, plural inner leads (lead) 21b arranged in a radial pattern around the semiconductor chip 1, plural outer leads 21c formed together with the inner lead 21b, and plural wires 7 connecting electrically an electrode pad 1c being a surface electrode formed for the main surface 1a of the semiconductor chip 1 with the inner lead 21b corresponding to the electrode pad 1C.

Furthermore, the QFP 20 has a die pad (also called a tab) 21*a* being a chip mounting part having the semiconductor chip 1 fixed via such die bonding member 6 as silver paste; and the sealing body 4 that is formed from a sealing resin by the resin sealing and seals the semiconductor chip 1, the die pad 21*a*, plural wires 7, and plural inner leads 21*b*.

Because of being the QFP 20, plural outer leads 21*c* formed together with plural inner leads 21*b* project from the side surface of the sealing body 4 toward the outside in four directions, and outer leads 21*c* are bent in a gull-wing shape.

Because the QFP 20 is a wire bonding package as shown in FIG. 24, the semiconductor chip 1 mounted over the die pad 21*a* is mounted face-up with the main surface 1*a* upward. Accordingly, the die pad 21*a* is bonded with the rear surface 1*b* of the semiconductor chip 1 via the die bonding member 6. Furthermore, each of plural electrode pads 1*c* formed for the main surface 1*a* is connected electrically with the inner lead 21*b* via the wire 7. Consequently, the semiconductor chip 1 is connected electrically with the inner lead 21*b* and the outer lead 21*c* to be an external terminal.

Plural wires 7 can be gold or copper.

The inner lead 21*b*, the outer lead 21*c*, and the die pad 21*a* are formed by a thin plate-shaped member including a copper alloy and an iron-nickel alloy. The sealing body 4, which includes a thermosetting epoxy-based resin, is formed by the resin sealing.

The sealing body 4 is formed by the resin molding die 22 as shown in FIG. 25, like the sealing body 4 of the BGA 9 in accordance with the embodiment 1.

Next, the assembling process of the semiconductor device (QFP 20) in accordance with the embodiment 2 is explained along the manufacturing flowchart in FIG. 25.

First, dicing shown at Step S11 in FIG. 25 provides the semiconductor chip 1 with a good quality.

After that, the die bonding shown at Step S12 is performed. As shown in FIG. 24F, the semiconductor chip 1 is mounted via the die bonding member 6 on the die pad 21*a* of the lead frame 21. The die bonding member 6 bond the rear surface 1*b* of the semiconductor chip 1 and the die pad 21*a*.

Next, the wire bonding shown at Step S13 is performed. As shown in FIG. 24, the electrode pad 1*c* of the main surface 1*a* of the semiconductor chip 1 is connected electrically with inner lead 21*b* corresponding to the electrode pad 1 by using the wire 7. The wire 7 can be gold or copper.

Subsequently, the molding shown at Step S14 is performed. In the molding in accordance with the embodiment 2, the resin sealing like that in the embodiment 1 performed by using the resin molding die 22 in which cavities 14*a* and 15*f* are formed on both the upper die 14 and the lower die 15.

Concerning the cavity 14*a* of the upper die 14 of the resin molding die 22 in FIG. 25, the shape of corner parts of the inner peripheral surface 14*b* (see FIGS. 14 to 16) is the same that in accordance with the embodiment 1 in FIGS. 11 to 16.

Accordingly, in the resin filling during the molding of the QFP 20, too, the same state as the state in FIGS. 17 to 20 is created in the cavity 14*a* of the upper die 14 arranged with the semiconductor chip 1. The resin filling is performed while pushing out the void 12 contained in the resin into air vents without allowing the void to remain in corner parts and the sealing body 4 is formed.

After the resin molding ends, the marking at Step S15 is performed for the intended mark 11 (see FIG. 10) to the sealing body 4. After that, the singulating at Step S16 is performed to end the assembling of the QFP 20. In the singulating, along with the cutting outer leads 21*c*, the bending into the gull-wing shape is performed.

In the manufacturing method of the QFP 20 of the embodiment 2, too, in the resin filling during the molding, the same state as the resin flowing state in FIGS. 17 to 20 can be created, and the void 12 contained in the resin can be pushed out into respective air vent without allowing the void to remain in corner part of the cavity 14*a*.

Consequently, like in the embodiment 1, the occurrence of the void 12 can be prevented in the cavity 14*a* (15*f*). The formation of the void can be prevented in the sealing body 4.

As a result, like in the QFP 20 (frame semiconductor device), too, the occurrence of the appearance defect of the QFP 20 can be prevented, and the yield of the QFP 20 can improve. Moreover, because the occurrence of the appearance defect of the QFP 20 can be prevented, the quality of the QFP 20 can improve.

Because other effects given by the QFP 20 are the same as the effect of the BGA 9 in the embodiment 1. The repeated explanations are omitted.

Next, a modified embodiment 2 is explained.

Figure 26:
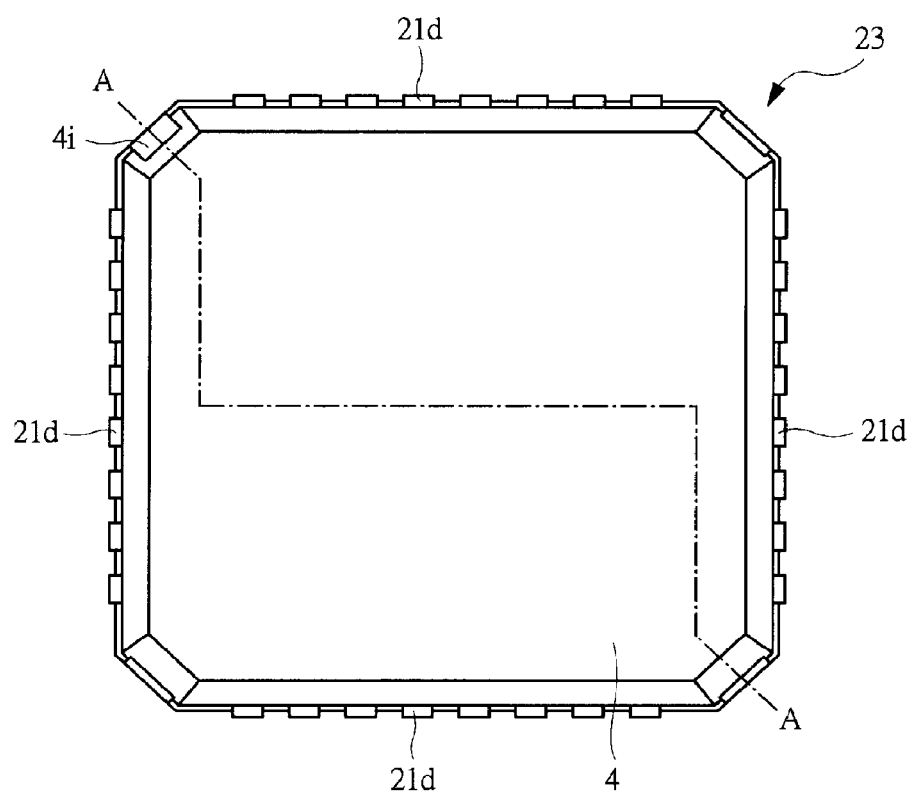
FIG. 26 is a plan view showing a modified structure of the semiconductor device in accordance with the embodiment 2 of the present invention.
Figure 27:
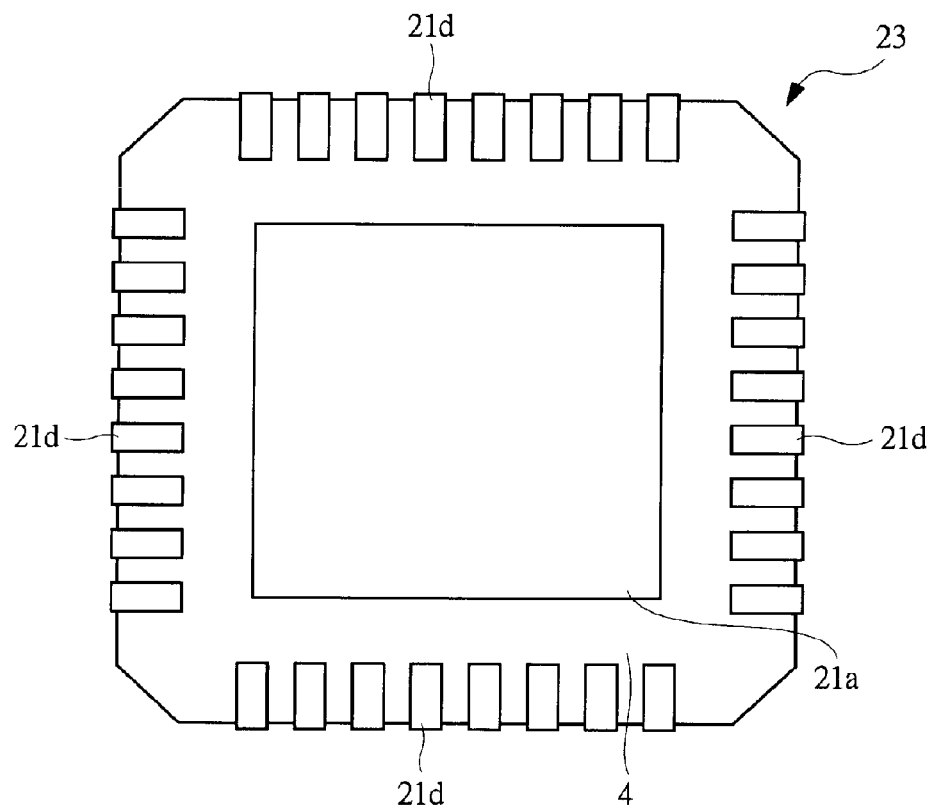
FIG. 27 is a back view showing a structure of the semiconductor device in FIG. 26.
Figure 28:
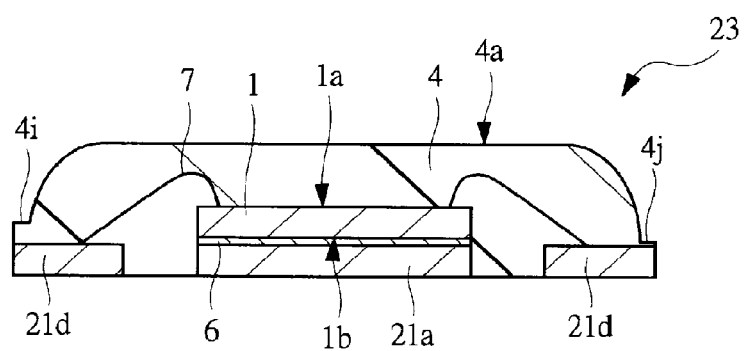
FIG. 28 is a cross-sectional view showing a structure cut along the A-A line in FIG. 26.
Figure 29:
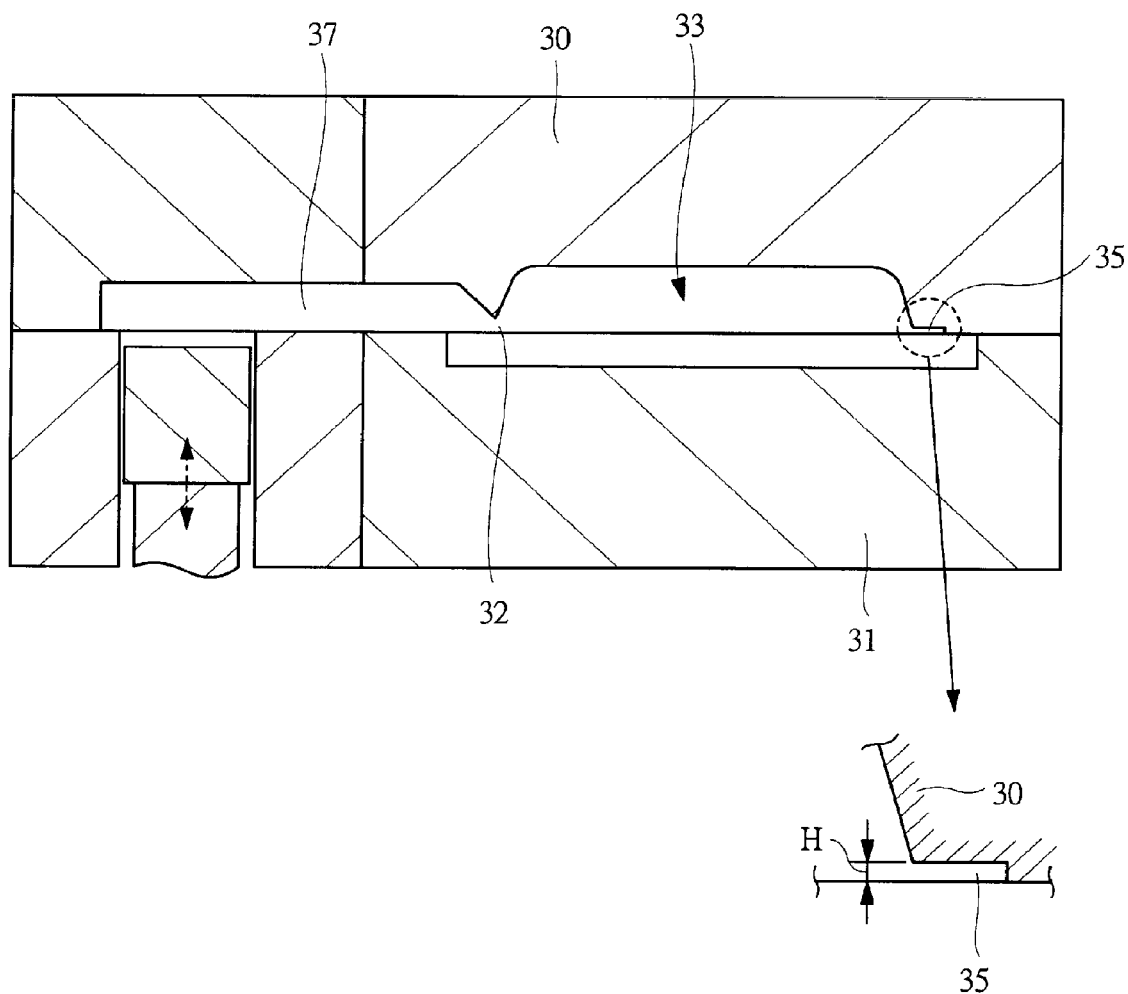
FIG. 29 is a cross-sectional view and a partially enlarged cross-sectional view showing the structure of a resin molding die in comparative example.
Figure 30:
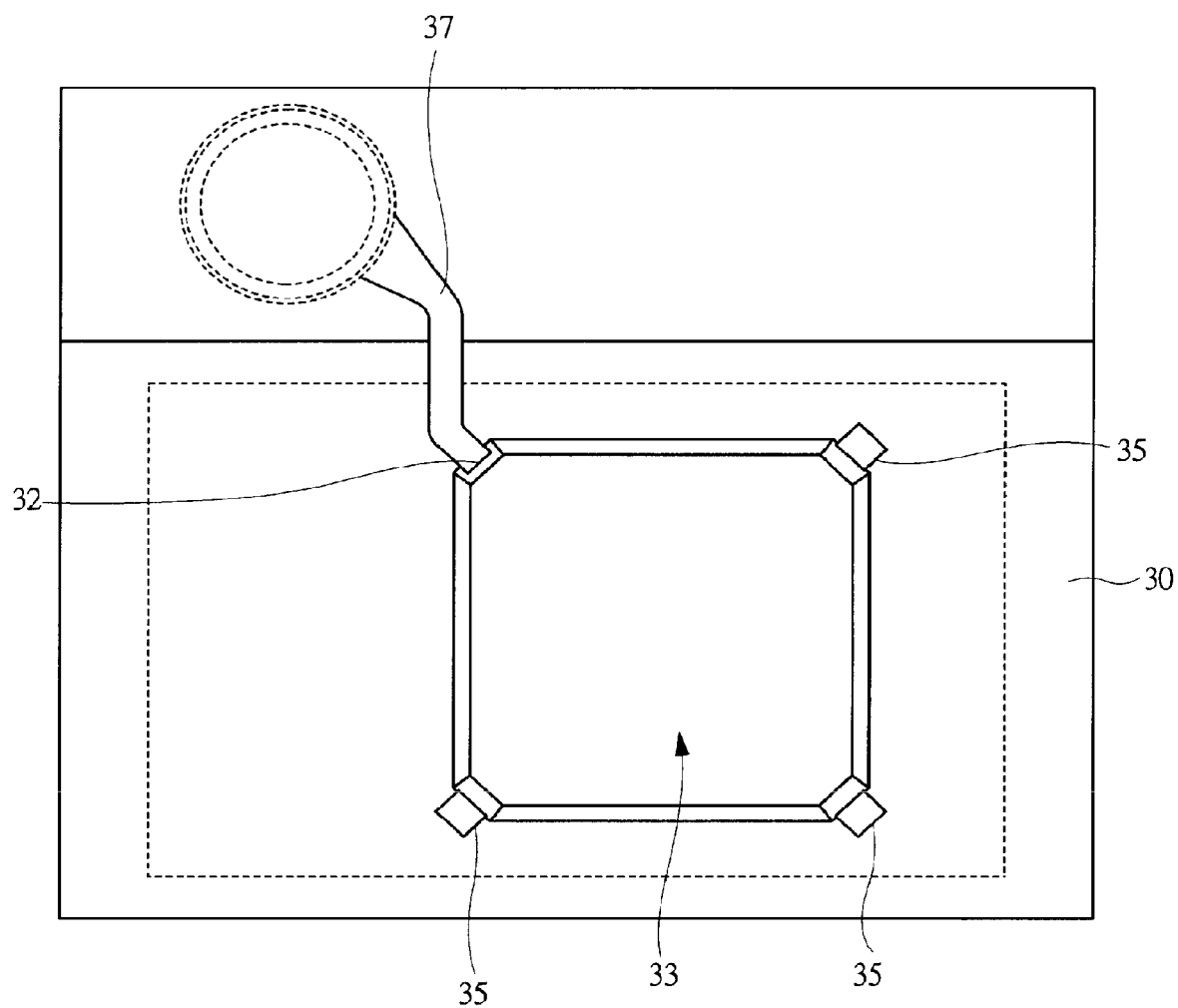
FIG. 30 is a transparent plan view showing the structure of the runner and the cavity of the upper die of the resin molding die in FIG. 29.
Figure 31:
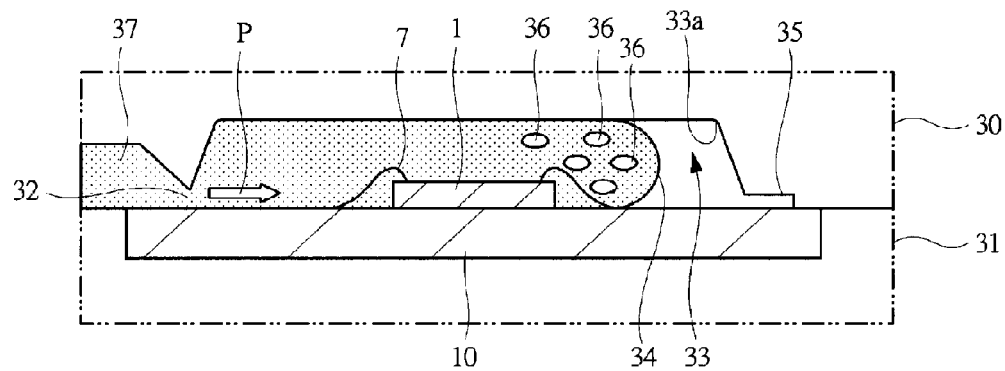
FIG. 31 is a partial cross-sectional view showing a resin flow state in molding in comparative example.
Figure 32:
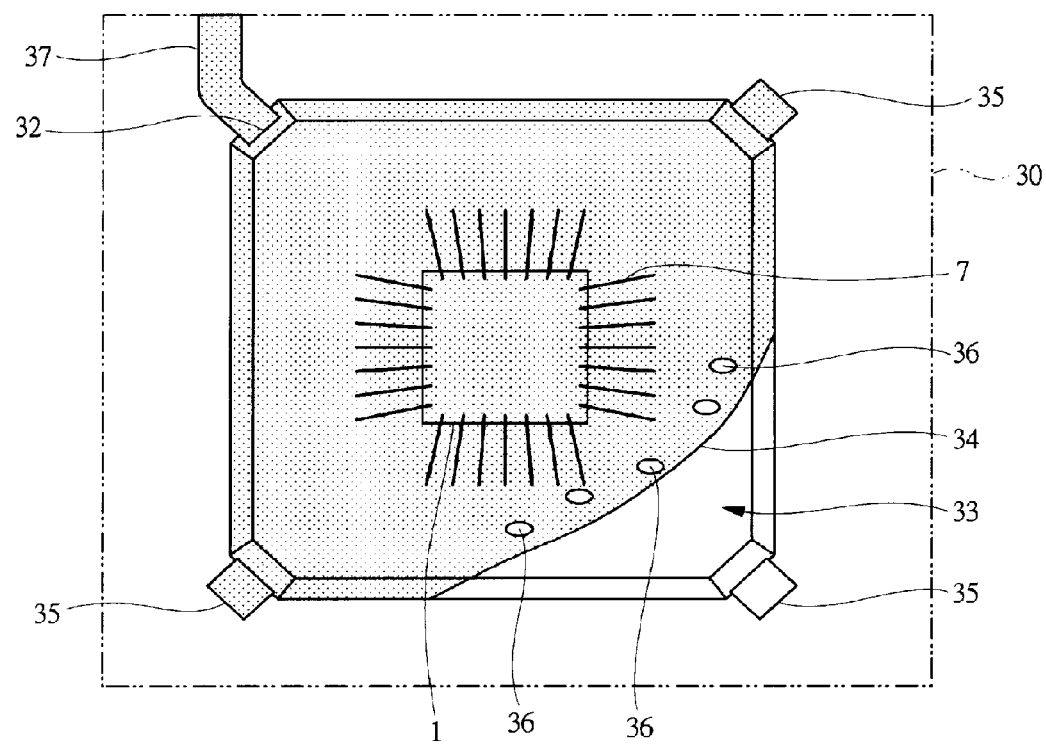
FIG. 32 is a partial plan view showing the resin flow state in FIG. 31.
Figure 33:
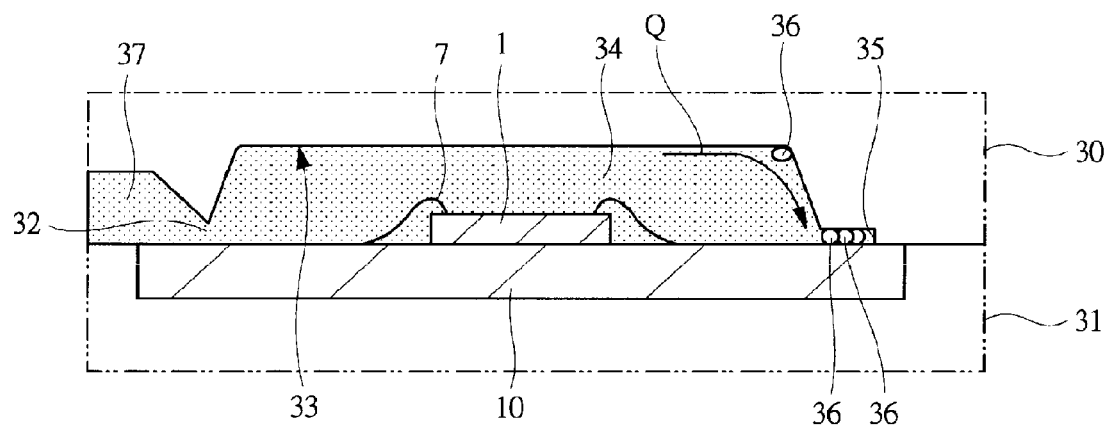
FIG. 33 is a partial cross-sectional view showing the resin filling completion state in molding in FIG. 31.
Figure 34:
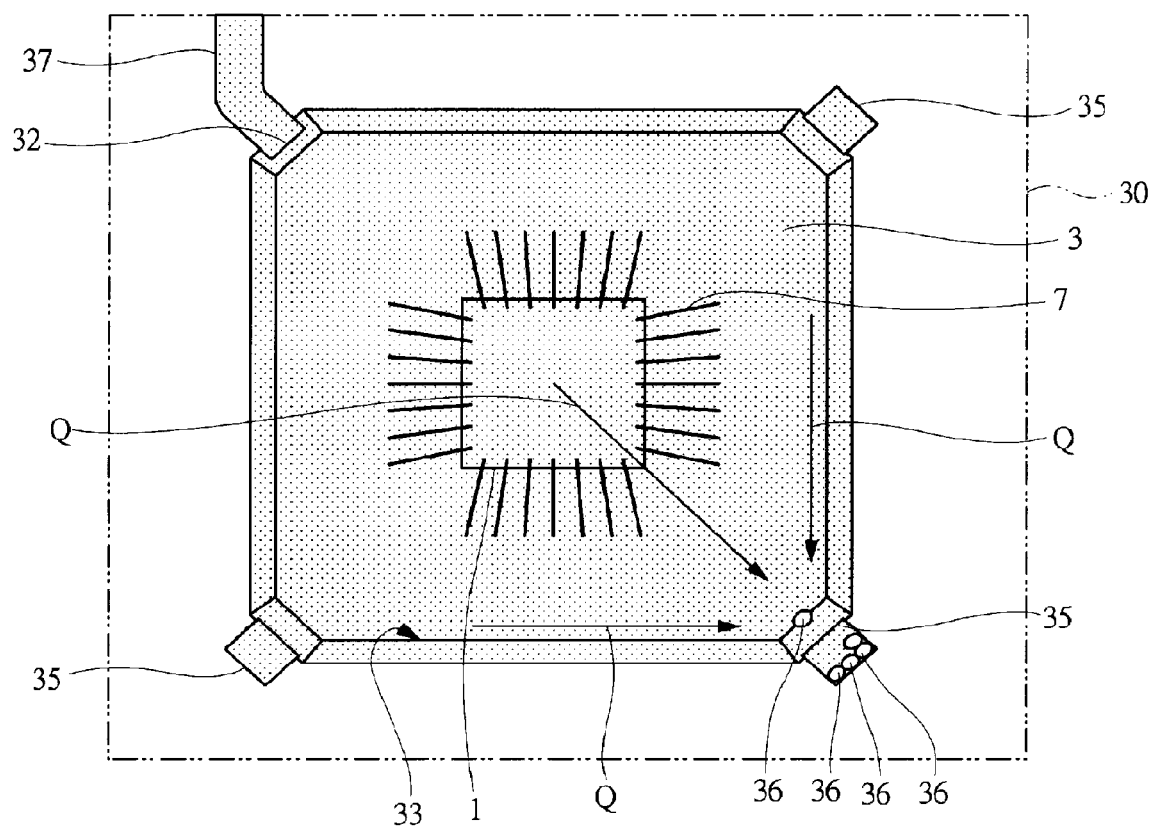
FIG. 34 is a partial plan view showing the resin filling completion state in FIG. 33.

FIG. 26 is a plan view showing the modified structure of the semiconductor device in accordance with the embodiment 2 of the present invention. FIG. 27 is a back view showing a structure of the semiconductor device in FIG. 26. FIG. 28 is a cross-sectional view showing a structure cut along the A-A line in FIG. 26.

The modified example of the embodiment 2 shown in FIGS. 26 to 28 is a case that the semiconductor device is a QFN (Quad Flat Non-leaded Package) 23.

Similarly to the QFP 20, the QFN 23 is a frame semiconductor device assembled by using the lead frame 21 in FIG. 25. The QFN 23 is a small package arranged with plural lead parts (lead) 21*d* to be external terminals in an exposed state for the back surface peripheral part of the sealing body 4 as shown in FIG. 27.

In the QFN 23, too, as shown in FIG. 28, the semiconductor chip 1 and plural wires 7 are sealed with resin by the sealing body 4. The forming method of the sealing body 4 is exactly the same as that of the sealing body 4 of the BGA 9 in accordance with the embodiment 1. It is because the rear surface of the die pad 21*a* is exposed in the rear surface of the sealing body 4 as shown in FIG. 27 to give such structure that no resin flows into the rear surface side of the die pad 21*a*.

Accordingly, in the molding of the assembling of the QFN 23, too, the resin sealing is performed by using the same die as the resin molding die 13 in the embodiment 1 in FIGS. 11 to 16. In the resin filling, the state shown in FIGS. 17 to 20 is given to allow to push out the void 12 contained in the resin into air vents without allowing the void to remain in corner parts of the cavity 14*a*.

Consequently, like in the BGA 9, the occurrence of the void 12 can be prevented in the cavity 14*a*. The formation of a void can be prevented in the sealing body 4.

As a result, the occurrence of the appearance defect of the QFN 23 (semiconductor device) can be prevented. The yield of the QFN 23 can improve. Moreover, because the occurrence of the appearance defect of the QFN 23 can be prevented; the quality of the QFN 23 can improve.

Other effects given by the QFN 23 are the same as effects of the BGA 9 in the embodiment 1. The repeated explanation is omitted.

The invention by the present inventor is, explained specifically in accordance with the embodiments of the invention. The present invention is not limited to the embodiments of the invention and can be changed within the scope that does not deviate from the purport.

In the embodiments 1 and 2, the case that the upper die 14 is the first die and the lower die 15 is the second die in the resin molding dies 13 and 22 is explained. If the upper die 14 and the lower die 15 are a pair, either of them may be the first die or the second die.

Further, in the embodiment 1, the die shown in FIG. 12 and FIGS. 14 to 16, the radius r2 of the cross section of the second corner part 14f of the cavity 14a is the same as the radius r3 of that of the third corner part 14g (r2=r3). All the cross sections of inner peripheral surfaces 14b of the corner parts (the rB part, the rC part, the rD part, the rE part, the rF part, the rG part, the rH part, and the rI part) of the cavity 14a forming edge parts including side surfaces and the upper surface 4a of the sealing body 4 in FIG. 1 are formed with the size of the radius r2 in FIG. 14 (also may be the radius r3 in FIG. 16). In the cavity 14a of the resin molding dies 13 and 22 of the embodiments 1 and 2, at least the radius r2 of the cross section of the inner peripheral surface 14b of the second corner part 14f (the corner part over the air vent in the position most separate from the injection gate 14d) is longer than radii of cross sections of inner peripheral surfaces 14b of other any corner part, radii of cross sections of inner peripheral surfaces 14b of corner parts (the rB part, the rC part, the rD part, the rE part, the rF part, the rG part, the rH part, and the rI part) are not necessarily the same as the radius r2.

Copper is harder than gold. When a copper wire with the same diameter is a gold one is used as the wire 7 instead of a gold wire, the copper wire is more resistant to the wire displacement. When copper wires become thinner, a countermeasure for the wire displacement is necessary. The described characteristics are effective in solving the problem.

The present invention is suitable to assemble electronic devices using a resin sealing method.

What is claimed is:

1. A method of manufacturing a semiconductor device comprising:
   (a) preparing a wiring member having a top surface over which a semiconductor chip is mounted,
   (b) disposing the wiring member on a die surface of a resin molding die having a cavity such that the semiconductor chip is located in the cavity of the resin molding die, and
   (c) forming a sealing body resin-sealing the semiconductor chip by injecting a resin into the cavity of the resin molding die,
   wherein the cavity of the resin molding die has a bottom surface, a first side surface, and a second side surface, a radius of an inner arc composed of portions of the bottom and first side surfaces being longer than a radius of an inner arc composed of portions of the first and second side surfaces, and
   wherein after the step (c), the sealing body has a top sealing surface, a first sealing side surface, and a second sealing side surface respectively formed by the bottom, first side, and second side surfaces of the cavity of the resin molding die, a radius of an inner arc composed of portions of the top sealing and first sealing side surfaces being longer than a radius of an inner arc composed of portions the first and second sealing side surfaces.

2. A method of manufacturing the semiconductor device according to claim 1,
   wherein a radius of an inner arc composed of portions of the bottom and second side surfaces of the cavity of the resin molding die is longer than the radius of the inner arc composed of portions of the first and second side surfaces of the cavity of the resin molding die, and
   wherein after the step (c), a radius of an inner arc composed of the top sealing and second sealing side surfaces of the sealing body is longer than the radius of the inner arc composed of portions of the first and second sealing side surfaces of the sealing body.

3. A method of manufacturing the semiconductor device according to claim 1, wherein an air vent is formed at the first side surface of the cavity of the resin molding die.

4. A method of manufacturing the semiconductor device according to claim 1, wherein the cavity of the resin molding die is substantially quadrangle shape in a plan view, a first corner potion of the cavity has a chamfer, the chamfer is the first side surface.

5. A method of manufacturing the semiconductor device according to claim 4,
   wherein the cavity of the resin molding die has a second corner portion opposite the first corner portion in a direction of a diagonal line of the cavity, and
   wherein in the step (c), the resin is injected into the cavity from the second corner portion.

6. A method of manufacturing the semiconductor device according to claim 1, wherein the wiring member is a wiring substrate.

7. A method of manufacturing the semiconductor device according to claim 6, further comprising:
   (d) after the step (c), disposing a plurality of solder balls over a bottom surface opposite the top surface of the wiring member.

* * * * *